US012701859B2

(12) United States Patent     (10) Patent No.: US 12,701,859 B2

Hwang et al.     (45) Date of Patent: Aug. 4, 2026

(54) DISPLAY DEVICE

(71) Applicant: Samsung Display Co., Ltd., Yongin-si (KR)

(72) Inventors: Seong-Yong Hwang, Seongnam-si (KR); Shinya Onoue, Hwaseong-si (KR); Dongjin Jeong, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 760 days.

(21) Appl. No.: 17/951,096

(22) Filed: Sep. 23, 2022

(65) Prior Publication Data

US 2023/0098923 A1     Mar. 30, 2023

(30) Foreign Application Priority Data

Sep. 24, 2021    (KR) ........................ 10-2021-0126302

(51) Int. Cl.
| | |
|---|---|
| *H10K 50/86* | (2023.01) |
| *H01Q 1/24* | (2006.01) |
| *H10K 50/844* | (2023.01) |
| *H10K 59/122* | (2023.01) |
| *H10K 102/00* | (2023.01) |

(52) U.S. Cl.
CPC ........... H10K 50/865 (2023.02); H01Q 1/243 (2013.01); H10K 50/844 (2023.02); H10K 59/122 (2023.02); *H10K 2102/311* (2023.02)

(58) Field of Classification Search
None
See application file for complete search history.

(56) References Cited

U.S. PATENT DOCUMENTS

| | | | |
|---|---|---|---|
| 11,038,264 B2 | 6/2021 | Son et al. | |
| 11,216,108 B2 | 1/2022 | Kim et al. | |
| 2018/0203555 A1 | 7/2018 | Miyamoto | |
| 2018/0374912 A1 * | 12/2018 | Zhang | H10K 59/40 |
| 2019/0164995 A1 * | 5/2019 | Lee | H10D 86/411 |
| 2020/0021016 A1 * | 1/2020 | Son | H01Q 21/062 |
| 2020/0168157 A1 * | 5/2020 | Kim | H05K 9/0084 |
| 2020/0210006 A1 * | 7/2020 | Son | G06F 3/0446 |

(Continued)

FOREIGN PATENT DOCUMENTS

| | | | | |
|---|---|---|---|---|
| CN | 110224081 B | * | 4/2022 | .......... G06F 1/1652 |
| EP | 3598572 A1 | | 1/2020 | |

(Continued)

OTHER PUBLICATIONS

CN 110224081 B Translation (Year: 2022).*

(Continued)

*Primary Examiner* — Sue A Purvis
*Assistant Examiner* — Carnell Hunter, III
(74) *Attorney, Agent, or Firm* — CANTOR COLBURN LLP

(57) ABSTRACT

A display device includes a display panel and a first shielding layer. The display panel includes a substrate, a display structure, and a sensing structure. The substrate includes a display area, a bending area, and a pad area. The display structure is disposed in the display area on the substrate. The sensing structure is disposed on the display structure, and includes sensing electrodes. The first shielding layer is disposed in the bending area on the substrate, and includes a same material as the sensing electrode.

22 Claims, 19 Drawing Sheets

(56)                    References Cited

U.S. PATENT DOCUMENTS

| | | | |
|---|---|---|---|
| 2020/0303490 A1* | 9/2020 | Tomioka .............. | H10K 50/844 |
| 2021/0234129 A1 | 7/2021 | Zhang | |
| 2021/0265451 A1* | 8/2021 | Son ........................ | H10D 86/60 |
| 2022/0109227 A1 | 4/2022 | Lee et al. | |

FOREIGN PATENT DOCUMENTS

| | | | |
|---|---|---|---|
| EP | 3805895 A1 | 4/2021 | |
| EP | 3982481 A1 | 4/2022 | |
| KR | 10-2020-0115907 | 10/2020 | |

OTHER PUBLICATIONS

Extended European search report dated Feb. 23, 2023, issued in European Patent Application No. 22197336.5.
Office Action mailed Nov. 29, 2024 in EP Application No. 22197336.5, 10 pages.
Korean Office Action mailed Oct. 2, 2025 in KR Application No. 10-2021-0126302, 21 pages (w/English-Language translation).

* cited by examiner

FIG. 10

DISPLAY DEVICE

CROSS REFERENCE TO RELATED APPLICATION

This application claims priority from and the benefit of Korean Patent Application No. 10-2021-0126302, filed on Sep. 24, 2021, which is hereby incorporated by reference for all purposes as if fully set forth herein.

BACKGROUND

Field

Embodiments of the invention relate generally to a display device and, more specifically, to a display device including an antenna and a signal shielding layer.

Discussion of the Background

Flat panel display devices are used as display devices for replacing a cathode ray tube display device due to light-weight and thin characteristics thereof. As representative examples of such flat panel display devices, there are a liquid crystal display device and an organic light emitting diode display device.

A display device may include a display panel configured to display an image, and an antenna configured to transmit and receive a radio frequency (RF) signal. In this case, the antenna may be disposed under the display panel. The display device may be configured such that a bending area of the display panel is bent to reduce a dead space, and a pad area of the display panel is adjacent to the antenna. While the antenna transmits and receives the RF signal, a driving integrated circuit disposed in the pad area of the display panel may be affected by the RF signal. In addition, a connection electrode configured to transmit a driving signal may be disposed in the bending area of the display panel, and the bending area of the display panel may also be close or adjacent to the antenna. While the antenna transmits and receives the RF signal, the connection electrode may also be affected by the RF signal. In this case, RF noise may cause a driving failure of the display device.

The above information disclosed in this Background section is only for understanding of the background of the inventive concepts, and, therefore, it may contain information that does not constitute prior art.

SUMMARY

Applicant discovered that an antenna of a display device may cause a malfunction of the display device when the antenna is close or adjacent to a driving integrated circuit and signal lines connected to the driving integrated circuit.

Display devices constructed according to the principles of the invention are capable of preventing the malfunction of the display devices by protecting the driving integrated circuit and the signal lines from RF noise, which is generated by the antenna, by forming a signal shielding layer.

Additional features of the inventive concepts will be set forth in the description which follows, and in part will be apparent from the description, or may be learned by practice of the inventive concepts.

According to an aspect of the invention, a display device includes a display panel and a first shielding layer. The display panel includes a substrate, a display structure, and a sensing structure. The substrate includes a display area, a bending area, and a pad area. The display structure is disposed in the display area on the substrate. The sensing structure is disposed on the display structure, and includes sensing electrodes. The first shielding layer is disposed in the bending area on the substrate, and includes a same material as the sensing electrode.

The display panel may further include connection electrodes disposed in the bending area on the substrate, and the first shielding layer may cover the connection electrodes.

The display panel disposed in the bending area may be bent, and the display device may further include an antenna disposed under the display panel disposed in the pad area.

The first shielding layer may be configured to prevent a noise signal generated by the antenna from being transmitted to the connection electrode.

The first shielding layer may include a first metal layer including titanium, a second metal layer disposed on the first metal layer and including aluminum, and a third metal layer disposed on the second metal layer and including titanium.

The display panel may further include an encapsulation structure disposed on the display structure, and the encapsulation structure may include a first inorganic encapsulation layer, an organic encapsulation layer, and a second inorganic encapsulation layer. The first inorganic encapsulation layer may include an inorganic insulating material. The organic encapsulation layer may be disposed on the first inorganic encapsulation layer, and may include an organic insulating material. The second inorganic encapsulation layer may be disposed on the organic encapsulation layer, and may include an inorganic insulating material.

The sensing structure may include a sensing connection electrode disposed on the encapsulation structure, a first insulating layer disposed on the sensing connection electrode, and a second insulating layer disposed on the first insulating layer. The sensing electrodes may be disposed between the first and second insulating layers.

The first shielding layer may include a same material as the sensing connection electrode, a first sensing electrode, or a second sensing electrode.

The display panel may further include insulating layers, a blocking structure, and an organic insulating structure. The insulating layers may be disposed on the substrate, and may include openings that expose a top surface of the substrate disposed in the bending area. The blocking structure may be disposed in the display area that is adjacent to the bending area on the insulating layers, and may be configured to prevent a leakage of the organic encapsulation layer. The organic insulating structure may be disposed in the openings of the insulating layers on the substrate.

The display panel may further include a first planarization layer disposed in the display area on the insulating layers, a second planarization layer disposed on the first planarization layer, and a pixel defining layer disposed on the second planarization layer.

The blocking structure may include a first blocking pattern, a second blocking pattern, and a third blocking pattern. The first blocking pattern may include a same material as the first planarization layer. The second blocking pattern may be disposed on the first blocking pattern, and may include a same material as the second planarization layer. The third blocking pattern may be disposed on the second blocking pattern, and may include a same material as the pixel defining layer.

The organic insulating structure may include a first organic insulating layer, a second organic insulating layer, a third organic insulating layer, and a fourth organic insulating layer. The first organic insulating layer may fill the openings, and may include a same material as the first planarization layer. The second organic insulating layer may be disposed on the first organic insulating layer, and may include a same material as the second planarization layer. The third organic insulating layer may be disposed on the second organic insulating layer, and may include a same material as the pixel defining layer. The fourth organic insulating layer may be disposed on the third organic insulating layer.

A portion of the first shielding layer may be disposed on a top surface of the organic insulating structure.

The display panel may further include an organic insulating pattern disposed on the blocking structure and the organic insulating structure, and the first shielding layer may be disposed on the organic insulating pattern.

The display device may further include a driving integrated circuit disposed in the pad area on the display panel and a second shielding layer covering the driving integrated circuit.

The first shielding layer may extend from the bending area to the pad area, and a portion of the second shielding layer may overlap the first shielding layer.

The display panel may further include pad electrodes spaced apart from the driving integrated circuit in the pad area on the substrate, and the display device may further include a connection film connected to the pad electrodes. The connection film may be configured to transmit signals generated by an external device to the display panel through the pad electrodes.

A portion of the second shielding layer may overlap the connection film.

The display device may further include a bending protection layer disposed on the first shielding layer, and may be configured to move a neutral plane of the display device in the bending area toward the bending protection layer.

The display device may further include a polarizing film disposed on the sensing structure, and may be configured to block an external light that is incident from an outside.

According to another aspect of the invention, a display device includes a substrate, a display structure, a sensing structure, connection electrodes, a first shielding layer, a driving integrated circuit, and a second shielding layer. The substrate includes a display area, a bending area, and a pad area, and is bent in the bending area. The display structure is disposed in the display area on the substrate. The sensing structure is disposed on the display structure, and includes sensing electrodes. The connection electrodes are disposed in the bending area on the substrate. The first shielding layer covers the connection electrodes on the connection electrodes, and includes a same material as the sensing electrode. The driving integrated circuit is disposed in the pad area on the substrate. The second shielding layer covers the driving integrated circuit on the driving integrated circuit.

The first shielding layer and the second shielding layer may be noise blocking layers, and the second shielding layer may include a different material from the first shielding layer.

Since the display device according to the embodiments includes the first shielding layer and the second shielding layer, the first shielding layer and the second shielding layer may cover the connection electrodes, the driving integrated circuit, and a portion of the connection film. When the bending area of the display device is bent, the connection electrodes, the driving integrated circuit, and the connection film may be adjacent to the antenna, and the first shielding layer and the second shielding layer may reflect or absorb the RF signal generated by the antenna. Accordingly, RF noise may not interfere with driving of the display device.

According to the method of manufacturing the display device of the embodiments, the first shielding layer capable of reflecting or absorbing the RF signal is simultaneously formed with the sensing structure without an additional process, so that a manufacturing cost of the display device may be relatively reduced.

It is to be understood that both the foregoing general description and the following detailed description are illustrative and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate illustrative embodiments of the invention, and together with the description serve to explain the inventive concepts.

FIGS. 9 to 19 are cross-sectional views illustrating an embodiment of a method of manufacturing a display device according to the principles of the invention.

DETAILED DESCRIPTION OF THE EMBODIMENTS

Figure 1:
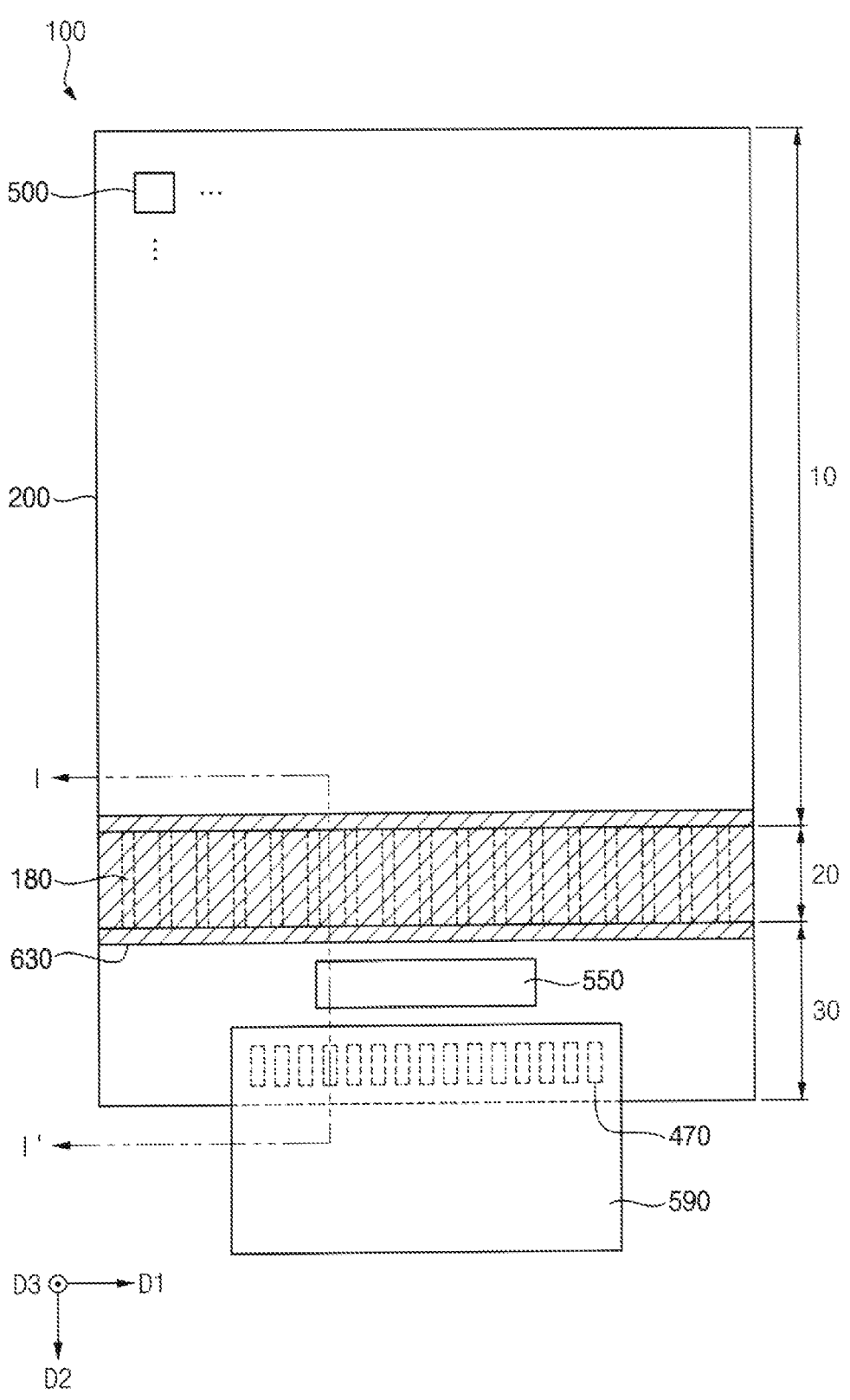
FIG. 1 is a plan view of an embodiment of a display device constructed according to the principles of the invention.

Hereinafter, display devices and a method of manufacturing a display device according to embodiments of the present disclosure will be described in detail with reference to the accompanying drawings. In the accompanying drawings, same or similar reference numerals refer to the same or similar elements.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing illustrative features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 2:
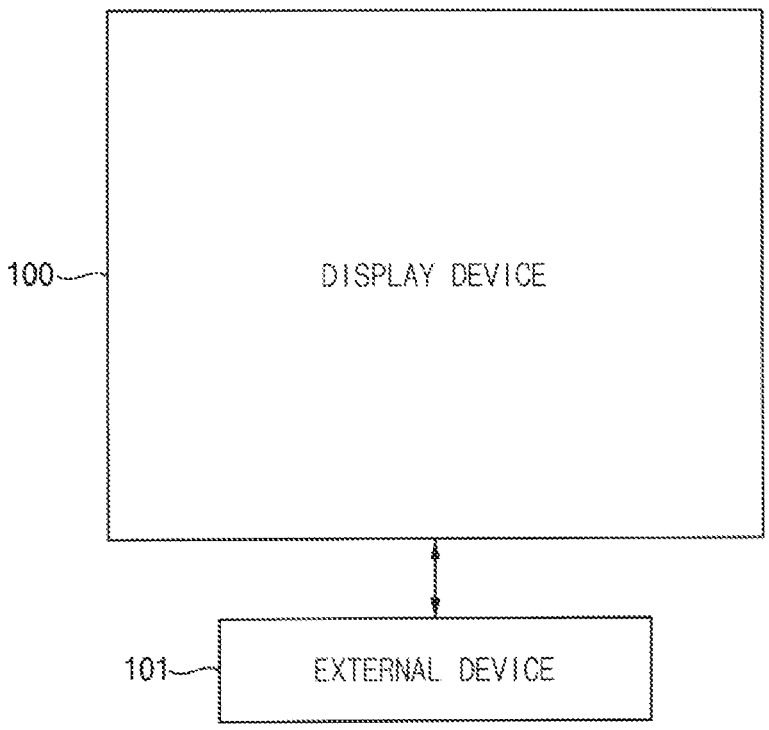
FIG. 2 is a block diagram illustrating an external device electrically connected to the display device of FIG. 1.

FIG. 1 is a plan view of a display device according to embodiments, and FIG. 2 is a block diagram illustrating an external device electrically connected to the display device of FIG. 1. For example, a display device 100 shown in FIG. 1 may be in a state before a display panel 200 is bent.

Referring to FIGS. 1 and 2, the display device 100 may include a display panel 200, a first shielding layer 630, a driving integrated circuit 550, a connection film 590, and the like. In this case, the display panel 200 may include display structures 500, connection electrodes 180, pad electrodes 470, and the like, and the display panel 200 may be divided into a display area 10, a bending area 20, and a pad area 30. For example, the first shielding layer 630 may be in the form of a noise blocking layer or a RF signal blocking layer.

As shown in FIG. 2, an external device 101 may be electrically connected to the display device 100. For example, the external device 101 may be electrically connected to the display device 100 through the connection film 590. The external device 101 may generate a driving signal, a driving voltage, and the like to display an image on the display panel 200.

The pad electrodes 470 may be disposed in the pad area 30. The pad electrodes 470 may be spaced apart from each other in a first direction D1. In this case, the first direction D1 may be a direction that is substantially parallel to a top surface of the display device 100. Some of the pad electrodes 470 may be connected to the driving integrated circuit 550 through wires, and the rest of the pad electrodes 470 may be connected to the connection electrodes 180. Each of the pad electrodes 470 may include a metal, an alloy, metal nitride, conductive metal oxide, a transparent conductive material, and the like. These may be used alone or in combination with each other. According to other embodiments, each of the pad electrodes 470 may have a multilayer structure including a plurality of metal layers. For example, the metal layers may have different thicknesses from each other, or may include different materials from each other.

One end of the connection film 590 may be electrically connected to the pad electrodes 470, and an opposite end of the connection film 590 may be electrically connected to the external device 101. In other words, the driving signal, the driving voltage, and the like generated by the external device 101 may be provided to the driving integrated circuit 550 and the connection electrodes 180 through the connection film 590 and the pad electrodes 470. The connection film 590 may include a flexible printed circuit board (FPCB), a printed circuit board (PCB), a flexible flat cable (FFC), and the like.

The driving integrated circuit 550 may be disposed in the pad area 30 on the display panel 200, and the driving integrated circuit 550 may be disposed between the connection electrodes 180 and the pad electrodes 470 when viewed in a plan view of the display device 100. The driving integrated circuit 550 may convert a digital data signal among driving signals into an analog data signal and provide the analog data signal to the connection electrodes 180. For example, the driving integrated circuit 550 may be a data driver. According to other embodiments, the display device 100 may further include a gate driver, and the gate driver may be disposed on one side of the display area 10.

The connection electrodes 180 may be disposed in the bending area 20. The connection electrodes 180 may be spaced apart from each other in the first direction D1. The connection electrodes 180 may be electrically connected to the display structures 500, and may provide the driving signal, the driving voltage, and the like to the display structures 500. Each of the connection electrodes 180 may include a metal, an alloy, metal nitride, conductive metal oxide, a transparent conductive material, and the like. These may be used alone or in combination with each other. According to other embodiments, each of the connection electrodes 180 may have a multilayer structure including a plurality of metal layers. For example, the metal layers may have different thicknesses from each other, or may include different materials from each other.

The first shielding layer 630 may be disposed in a portion of the display area 10, the bending area 20, and a portion of the pad area 30. The first shielding layer 630 may be disposed on the connection electrodes 180, and may cover the connection electrodes 180. The display device 100 may further include an antenna configured to transmit and receive an RF signal, and the first shielding layer 630 may reflect or absorb the RF signal (e.g., an RF signal within a low frequency band or noise signal) generated by the antenna. In other words, when the first shielding layer 630 is provided, the RF signal may not be transmitted to the connection electrodes 180. The first shielding layer 630 may include a metal, an alloy, metal nitride, conductive metal oxide, a transparent conductive material, and the like. For example, the first shielding layer 630 may include gold (Au), silver (Ag), aluminum (Al), tungsten (W), copper (Cu), platinum (Pt), nickel (Ni), titanium (Ti), palladium (Pd), magnesium (Mg), calcium (Ca), lithium (Li), chromium (Cr), tantalum (Ta), molybdenum (Mo), scandium (Sc), neodymium (Nd), iridium (Ir), an aluminum-containing alloy, aluminum nitride ($AlN_x$), a silver-containing alloy, tungsten nitride ($WN_x$), a copper-containing alloy, a molybdenum-containing alloy, titanium nitride ($TiN_x$), chromium nitride ($CrN_x$), tantalum nitride ($TaN_x$), strontium ruthenium oxide ($SrRu_xO_y$), zinc oxide ($ZnO_x$), indium tin oxide (ITO), tin oxide ($SnO_x$), indium oxide ($InO_x$), gallium oxide ($GaO_x$), indium zinc oxide (IZO), and the like. These may be used alone or in combination with each other. According to embodiments, the first shielding layer 630 may have a multilayer structure in which a first metal layer including Ti, a second metal layer including Al, and a third metal layer including Ti are stacked.

The display structures 500 configured to emit lights (e.g., a display structure 500 of FIG. 6) may be disposed in the display area 10. The display structures 500 may be arranged in the first direction D1 and a second direction D2 within the display area 10. In this case, the second direction D2 may be a direction that is substantially orthogonal to the first direction D1. Wires connected to the display structures 500 may also be disposed in the display area 10. For example, the wires may include a data signal wire, a gate signal wire, a power supply wire, and the like.

However, although each of the display area 10, the bending area 20, and the pad area 30 according to an embodiment has been described as having a rectangular shape when viewed in a plan view, embodiments are not limited thereto. For example, each of the display area 10, the bending area 20, and the pad area 30 may have a triangular shape, a rhombic shape, a polygonal shape, a circular shape, a track shape, or an elliptical shape when viewed in a plan view.

Figure 3:
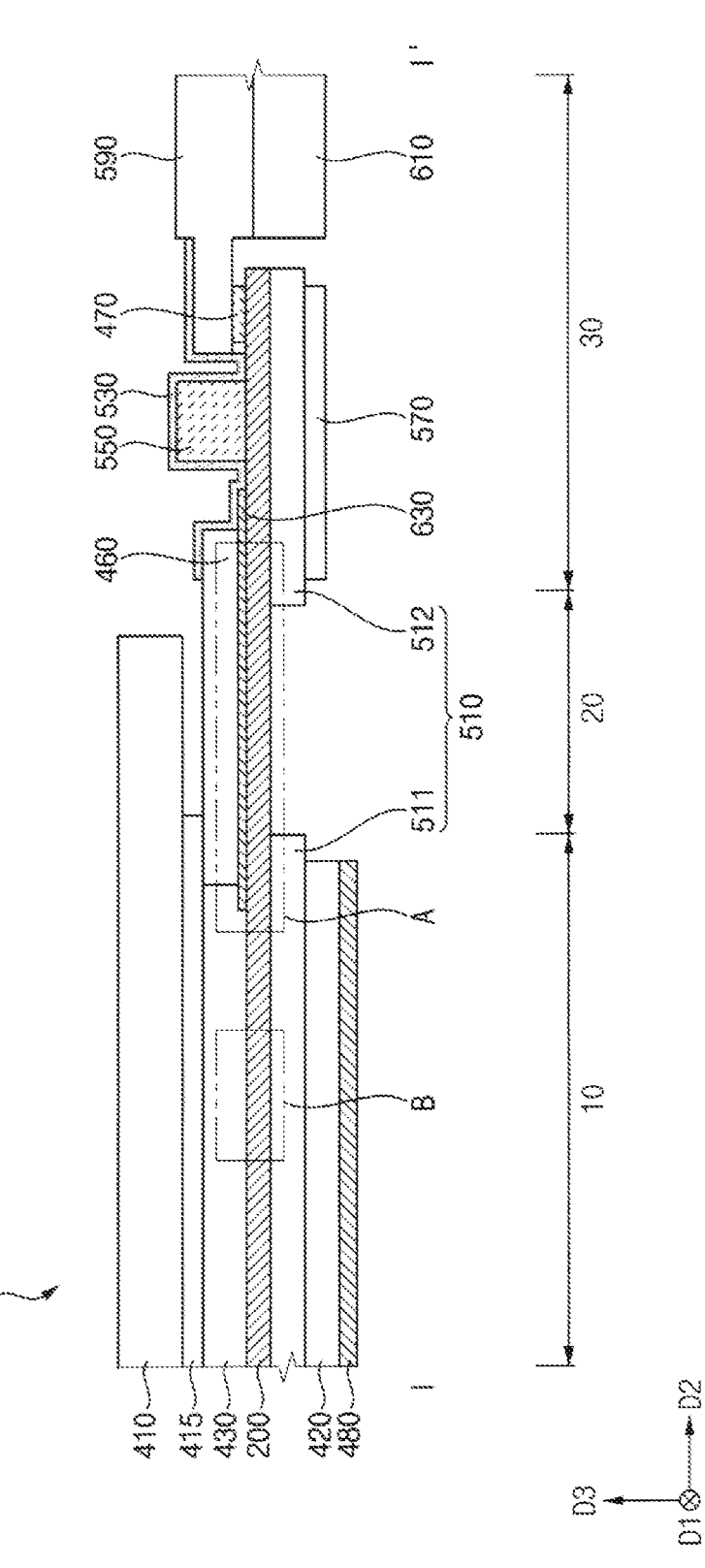
FIG. 3 is a cross-sectional view taken along line I-I' of FIG. 1.
Figure 4:
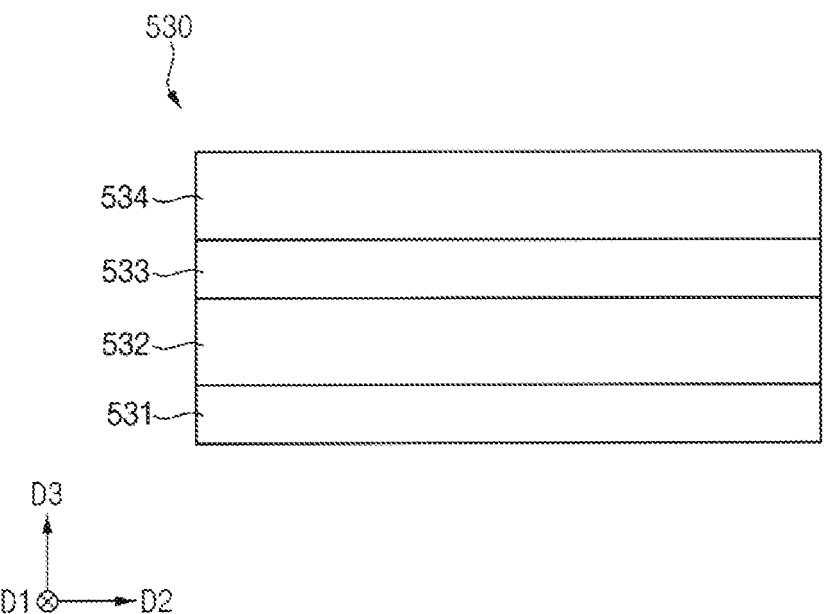
FIG. 4 is a cross-sectional view of a second shielding layer of FIG. 3.
Figure 5:
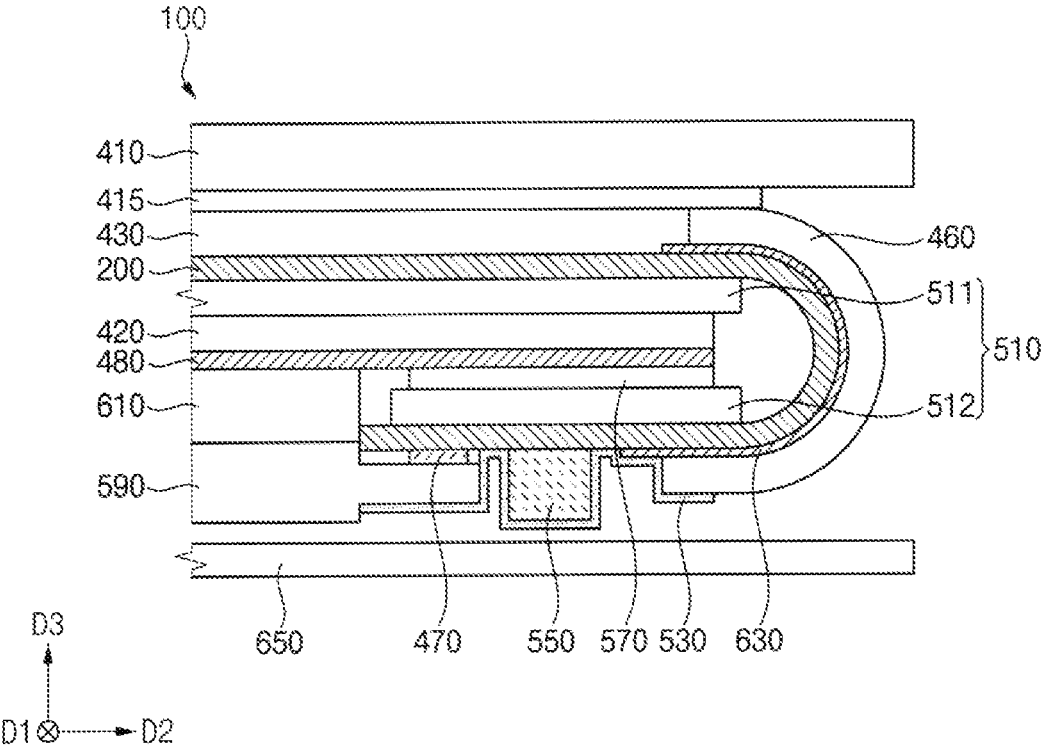
FIG. 5 is a cross-sectional view illustrating a state in which the display device of FIG. 4 is bent.

FIG. 3 is a cross-sectional view taken along line I-I' of FIG. 1, FIG. 4 is a cross-sectional view of a second shielding layer of FIG. 3, and FIG. 5 is a cross-sectional view illustrating a state in which the display device of FIG. 4 is bent. For example, the display device 100 shown in FIG. 3 may be in a state before the display panel 200 is bent, and the display device 100 shown in FIG. 5 may be in a state in which the display panel 200 is bent. The display device 100 may be provided in a state in which the bending area 20 of the display panel 200 is bent.

Referring to FIGS. 3, 4, and 5, the display device 100 may include a display panel 200, a lower protective film 510, a lower adhesive layer 420, a spacer 570, a functional member 480, a polarizing film 430, a bending protection layer 460, an upper adhesive layer 415, a cover window 410, a first shielding layer 630, a driving integrated circuit 550, a second shielding layer 530, a connection film 590, a conductive tape 610, an antenna 650, and the like. In this case, the display panel 200 may include a pad electrode 470, and the lower protective film 510 may include a first protective film 511 and a second protective film 512. In addition, the second shielding layer 530 may include a conductive adhesive layer 531, a conductive layer 532, an adhesive layer 533, and a signal absorption layer 534. For example, the second shielding layer 530 may be in the form of a noise blocking layer or a RF signal blocking layer.

The lower protective film 510 may be disposed on a bottom surface of the display panel 200. For example, the first protective film 511 may be disposed in the display area 10 on the bottom surface of the display panel 200, and the second protective film 512 may be disposed in the pad area 30 on the bottom surface of the display panel 200. In other words, the lower protective film 510 may not be disposed in the bending area 20 on the bottom surface of the display panel 200. The lower protective film 510 may protect the bottom surface of the display panel 200. The lower protective film 510 may include an organic insulating material such as a photoresist, a polyacryl-based resin, a polyimide-based resin, a polyamide-based resin, a siloxane-based resin, an acryl-based resin, and an epoxy-based resin. In some embodiments, the lower protective film 510 may include polyethylene terephthalate (PET), polyethylene naphthalene (PEN), polypropylene (PP), polycarbonate (PC), polystyrene (PS), polysulfone (PSul), polyethylene (PE), polyphthalamide (PPA), polyethersulfone (PES), polyarylate (PAR), polycarbonate oxide (PCO), modified polyphenylene oxide (MPPO), and the like.

According to other embodiments, an adhesive member may be disposed between the display panel 200 and the lower protective film 510. The adhesive member may adhere the lower protective film 510 to the bottom surface of the display panel 200. The adhesive member may be disposed in the bending area 20.

The lower adhesive layer 420 may be disposed on a bottom surface of the first protective film 511. The lower adhesive layer 420 may adhere the functional member 480 to the bottom surface of the first protective film 511. The lower adhesive layer 420 may include an optical-clear adhesive (OCA), a pressure-sensitive adhesive (PSA), an optical-clear resin (OCR), and the like.

The functional member 480 may be disposed on a bottom surface of the lower adhesive layer 420. The functional member 480 may include a digitizer, a heat dissipation plate, and the like. For example, the digitizer may be a device configured to convert coordinates of an input device such as a pen into digital data when the input device approaches or contacts the cover window 410. The digitizer may operate by using an electromagnetic resonance (EMR) scheme. In addition, the heat dissipation plate may dissipate heat transferred to the bottom surface of the display panel 200. For example, the heat dissipation plate may include Al, an aluminum-containing alloy, Ag, a silver-containing alloy, W, Cu, a copper-containing alloy, Ni, Cr, Mo, a molybdenum-containing alloy, Ti, Pt, Ta, Nd, Sc, and the like.

The spacer 570 may be disposed on a bottom surface of the second protective film 512. As shown in FIG. 5, when the bending area 20 of the display panel 200 is bent, the spacer 570 may compensate for a step (e.g., height differences). In some embodiments, the spacer 570 may include an adhesive material, and the spacer 570 may be fixed to a bottom surface of the functional member 480. The spacer 570 may include an organic insulating material. According to other embodiments, the spacer 570 may include PET, PEN, PP, PC, PS, PSul, PE, PPA, PES, PAR, PCO, MPPO, and the like.

The polarizing film 430 may be disposed in the display area 10 on the display panel 200. According to the embodiments, a portion of the polarizing film 430 may overlap the first shielding layer 630 in the display area 10 that is adjacent to the bending area 20. The polarizing film 430 may block an external light that is incident to the display panel 200 from an outside. For example, the polarizing film 430 may include a linear polarization film and a λ/4 phase retardation film. The λ/4 phase retardation film may be disposed on the display panel 200. The λ/4 phase retardation film may convert or modify a phase of a light. For example, the λ/4 phase retardation film may convert a vertically oscillating light or a horizontally oscillating light into a right-handed circularly polarized light or a left-handed circularly polarized light, and may convert the right-handed circularly polarized light or the left-handed circularly polarized light into the vertically oscillating light or the horizontally oscillating light. The λ/4 phase retardation film may include a birefringent film including a polymer, an alignment film formed of a liquid crystal polymer, a film including an alignment layer formed of a liquid crystal polymer, and the like.

The linear polarization film may be disposed on the λ/4 phase retardation film. The linear polarization film may selectively transmit a light. For example, the linear polarization film may transmit the vertically oscillating light or the horizontally oscillating light. In this case, the linear polarization film may have a horizontal line pattern or a vertical line pattern. When the linear polarization film includes the horizontal line pattern, the linear polarization film may block the vertically oscillating light and transmit the horizontally oscillating light. When the linear polarization film has the vertical line pattern, the linear polarization film may block the horizontally oscillating light and transmit the vertically oscillating light. The light transmitted through the linear polarization film may pass through the λ/4 phase retardation film. As described above, the λ/4 phase retardation film may convert the phase of the light. For example, when the vertically oscillating light and the horizontally oscillating light pass through the linear polarization film, the linear polarization film having the horizontal line pattern may transmit the horizontally oscillating light. When the horizontally oscillating light passes through the λ/4 phase retardation film, the horizontally oscillating light may be converted into the left-handed circularly polarized light. The left-handed circularly polarized light may be reflected by an upper electrode 340 of FIG. 6, and the light may be converted into the right-handed circularly polarized light. When the right-handed circularly polarized light passes through the λ/4 phase retardation film, the light may be converted into the vertically oscillating light. In this case, the vertically oscillating light may not be transmitted through the linear polarization film having the horizontal line pattern. Accordingly, the light may be extinguished or blocked by the linear polarization film and the λ/4 phase retardation film. For example, the linear polarization film may include an iodine-based material, a dye-containing material, a polyene-based material, and the like.

The bending protection layer 460 may be disposed on the first shielding layer 630. The bending protection layer 460 may be disposed in a portion of the display area 10, the bending area 20, and a portion of the pad area 30. The bending protection layer 460 may upwardly move a neutral plane (e.g., a neutral surface or a neutral axis) of the display device 100 in the bending area 20 toward the bending protection layer 460. Since the neutral plane of the display device 100 is raised in the bending area 20, the connection electrodes 180 disposed in the bending area 20 may be bent without being broken. The bending protection layer 460 may include a photocurable resin, a thermosetting resin, and the like. For example, the bending protection layer 460 may include an epoxy resin, an amino resin, a phenol resin, a urea resin, a melamine resin, an unsaturated polyester resin, a polyurethane resin, a polyimide resin, and the like.

The upper adhesive layer 415 may be disposed on the polarizing film 430 and a portion of the bending protection layer 460. The upper adhesive layer 415 may adhere the cover window 410 onto the polarizing film 430 and the portion of the bending protection layer 460. The upper adhesive layer 415 may include an OCA, a PSA, an OCR, and the like.

The cover window 410 may be disposed on the upper adhesive layer 415. The cover window 410 may protect the polarizing film 430, the bending protection layer 460, the display panel 200, and the like. The cover window 410 may include tempered glass, reinforced plastic, and the like. In some embodiments, the cover window 410 may be configured as a single layer, or may have a stacked structure in which a plurality of functional layers are stacked.

The conductive tape 610 may be disposed on a bottom surface of the connection film 590. As shown in FIG. 5, when the bending area 20 of the display panel 200 is bent, the conductive tape 610 may compensate for a step (e.g., height differences). In addition, when the functional member 480 is a digitizer, the external device 101 and the digitizer may be electrically connected to each other through the conductive tape 610 and the connection film 590. In some embodiments, the conductive tape 610 may include an adhesive material, and the conductive tape 610 may be fixed to the bottom surface of the functional member 480. The conductive tape 610 may include an anisotropic conductive film and the like.

The second shielding layer 530 may be disposed in the pad area 30 on a portion of the bending protection layer 460, the driving integrated circuit 550, and a portion of the connection film 590. According to the embodiments, in the pad area 30 that is adjacent to the bending area 20, one end of the second shielding layer 530 may overlap the first shielding layer 630, and an opposite end of the second shielding layer 530 may overlap the connection film 590. In other words, the second shielding layer 530 may cover the driving integrated circuit 550 and the pad electrode 470. The second shielding layer 530 may reflect or absorb an RF signal (e.g., an RF signal within a low frequency band or noise signal) generated by the antenna 650. In other words, the RF signal may not be transmitted to the pad electrode 470 and the driving integrated circuit 550.

As shown in FIG. 4, the conductive adhesive layer 531, the conductive layer 532, the adhesive layer 533, and the signal absorption layer 534 may be sequentially stacked. The conductive adhesive layer 531 may make contact with a portion of the bending protection layer 460, a portion of the first shielding layer 630, the driving integrated circuit 550, a portion of the display panel 200, and a portion of the connection film 590. The conductive adhesive layer 531 may be a double-sided adhesive film including a conductive material. The conductive layer 532 may include a conductive material, and may be fixed between the conductive adhesive layer 531 and the adhesive layer 533. The adhesive layer 533 may be a double-sided adhesive film, and may adhere the conductive layer 532 and the signal absorption layer 534 to each other. The signal absorption layer 534 may include PET having a black color, and may be fixed to the adhesive layer 533. For example, the RF signal may be reflected or absorbed through the conductive material of the conductive adhesive layer 531, the conductive material of the conductive layer 532, and the PET having the black color of the signal absorption layer 534.

According to other embodiments, the second shielding layer 530 may make contact with only a portion of the bending protection layer 460, a top surface of the second shielding layer 530, and a portion of the connection film 590. In other words, the second shielding layer 530 may not make contact with the first shielding layer 630, and an empty space may be formed between the second shielding layer 530 and the display panel 200.

Referring again to FIG. 5, the antenna 650 may be disposed under the second shielding layer 530 and the first shielding layer 630. In other words, the display panel 200 disposed in the bending area 20 may be bent, and the antenna 650 may be disposed under the display panel 200 disposed in the pad area 30. In addition, the antenna 650 may face the cover window 410. The antenna 650 may transmit and receive the RF signal.

Since the display device 100 according to the embodiments includes the first shielding layer 630 and the second shielding layer 530, the first shielding layer 630 and the second shielding layer 530 may cover the connection electrodes 180, the driving integrated circuit 550, and a portion of the connection film 590. When the bending area 20 of the display device 100 is bent, the connection electrodes 180, the driving integrated circuit 550, and the connection film 590 may be adjacent to the antenna 650, and the first shielding layer 630 and the second shielding layer 530 may reflect or absorb the RF signal generated by the antenna 650. Accordingly, RF noise that interferes with driving of the display device 100 may be prevented or filtered.

Figure 6:
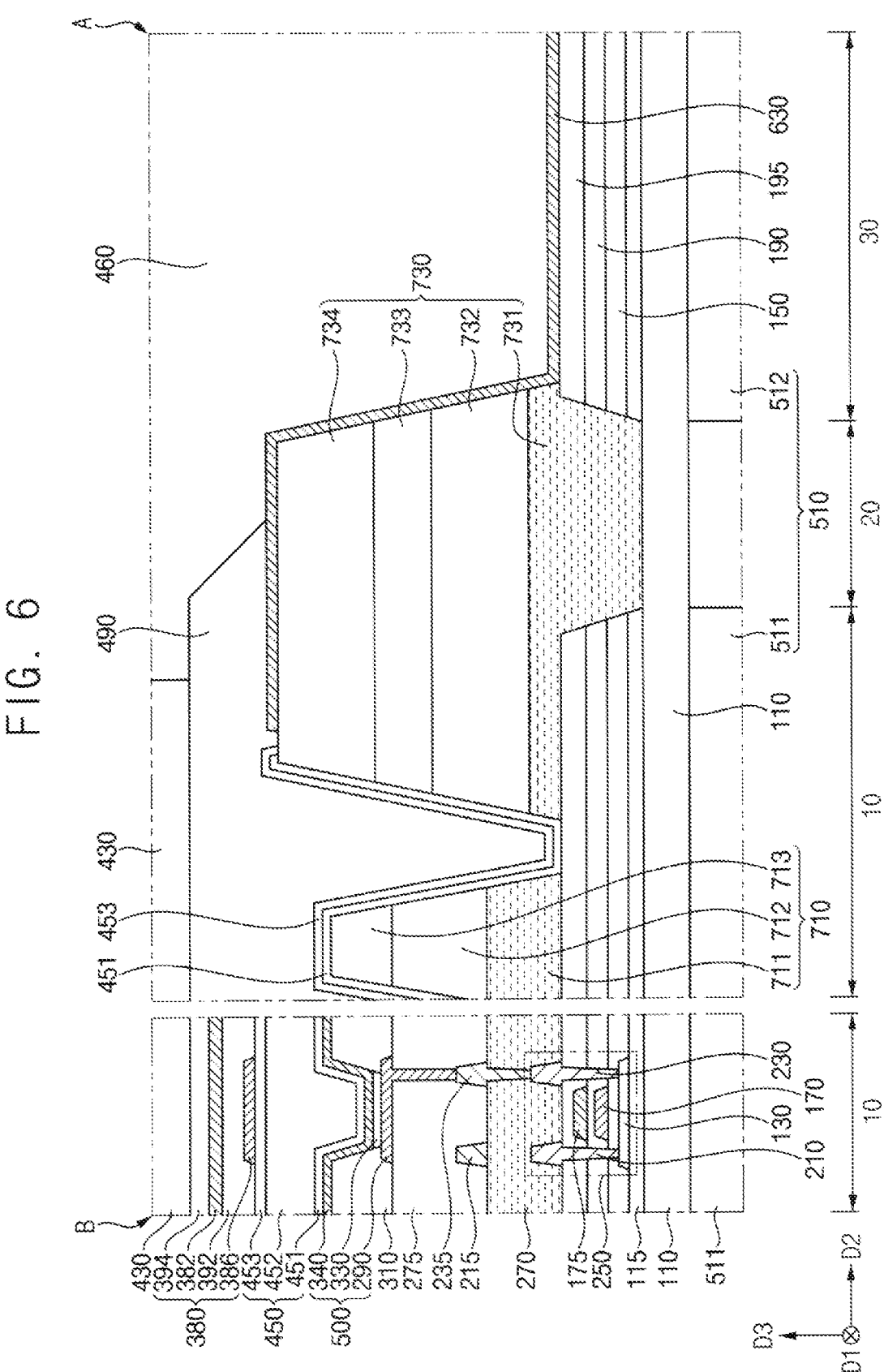
FIG. 6 is enlarged cross-sectional views of a region A and a region B of FIG. 3
Figure 7:
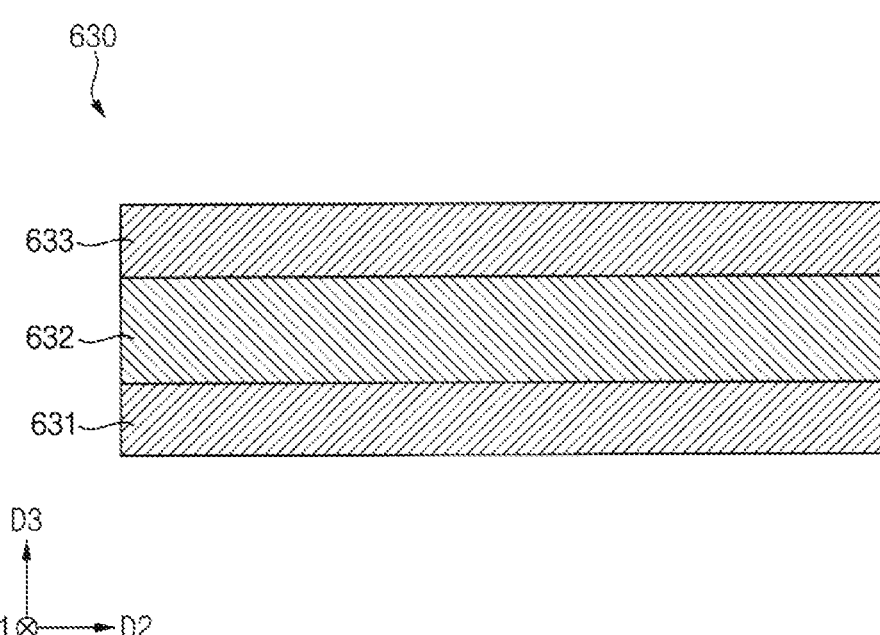
FIG. 7 is a cross-sectional view of a first shielding layer of FIG. 6.
Figure 8:
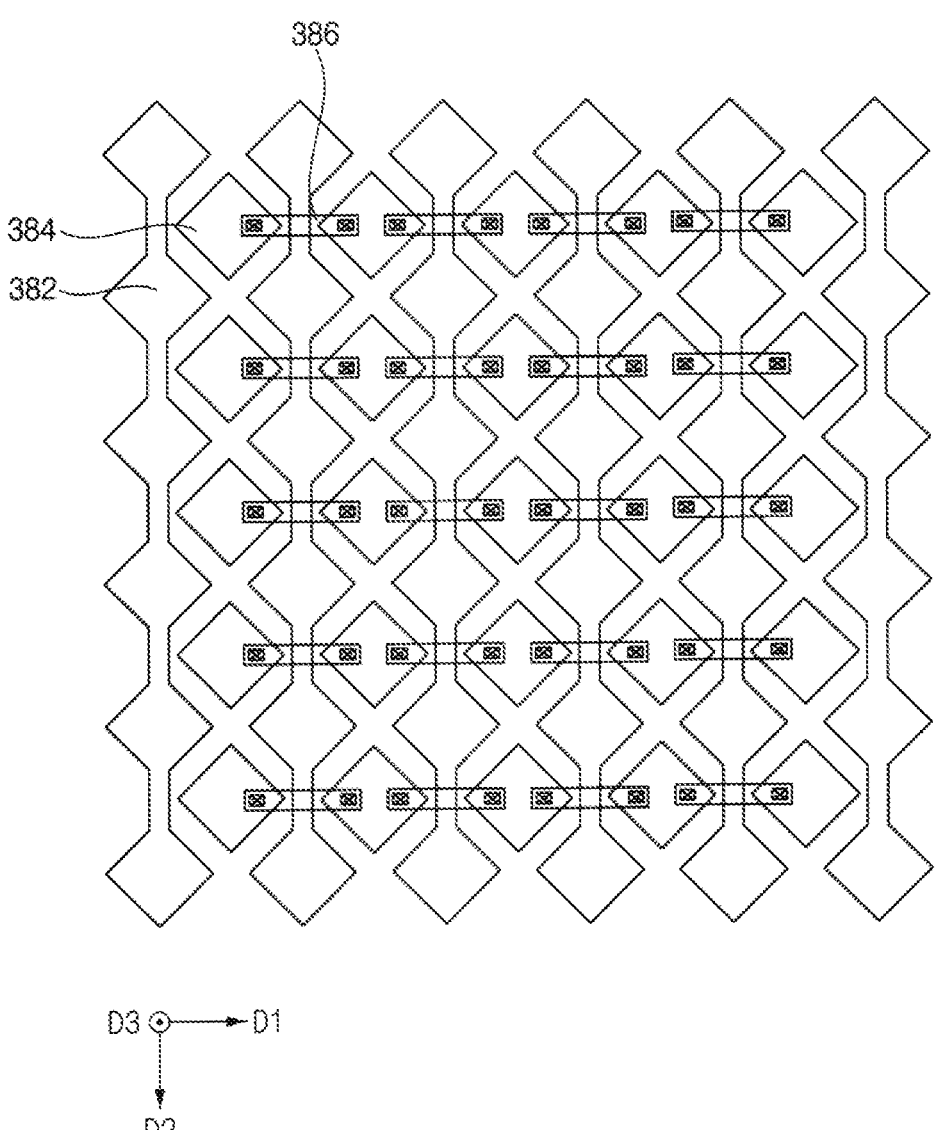
FIG. 8 is a plan view of a sensing structure included in the display device of FIG. 6.

FIG. 6 is a partially enlarged cross-sectional view of a region A and a region B of FIG. 3, FIG. 7 is a cross-sectional view of a first shielding layer of FIG. 6, and FIG. 8 is a plan view for describing a sensing structure included in the display device of FIG. 6.

Referring to FIGS. 6, 7, and 8, the display device 100 may include a display panel 200, a lower protective film 510 including a first protective film 511 and a second protective film 512, a polarizing film 430, a first shielding layer 630, a bending protection layer 460, and the like. In addition, the display panel 200 may include a substrate 110, a buffer layer 115, a gate insulating layer 150, a first interlayer insulating layer 190, a second interlayer insulating layer 195, a semiconductor element 250, a first planarization layer 270, a second planarization layer 275, a wire pattern 215, a connection pattern 235, a pixel defining layer 310, a display structure 500, a thin film encapsulation structure 450, a sensing structure 380, a blocking structure 710, an organic insulating structure 730, an organic insulating pattern 490, and the like. In this case, the semiconductor element 250 may include an active layer 130, a first gate electrode 170, a second gate electrode 175, a source electrode 210, and a drain electrode 230, and the display structure 500 may include a lower electrode 290, a light emitting layer 330, and an upper electrode 340. In addition, the thin film encapsulation structure 450 may include a first inorganic thin film encapsulation layer 451, an organic encapsulation layer 452, and a second inorganic thin film encapsulation layer 453, and the sensing structure 380 may include a sensing connection electrode 386, a first sensing electrode 382, a second sensing electrode 384, a first insulating layer 392, and a second insulating layer 394. Furthermore, the blocking structure 710 may include a first blocking pattern 711, a second blocking pattern 712, and a third blocking pattern 713, and the organic insulating structure 730 may include a first organic insulating layer 731, a second organic insulating layer 732, a third organic insulating layer 733, and a fourth organic insulating layer 734.

The substrate 110 including a transparent or opaque material may be provided. The substrate 110 may be configured as a transparent resin substrate. Examples of the transparent resin substrate that may be used as the substrate 110 include a polyimide substrate. In this case, the polyimide substrate may include a first polyimide layer, a first barrier film layer, a second polyimide layer, a second barrier film layer, and the like. In addition, since the display panel 200 is divided into the display area 10, the bending area 20, and the pad area 30, the substrate 110 may also include a display area 10, a bending area 20, and a pad area 30. In some embodiments, the substrate 110 may include a quartz substrate, a synthetic quartz substrate, a calcium fluoride substrate, a fluorine-doped quartz substrate, a soda lime glass substrate, a non-alkali glass substrate, and the like.

However, although the substrate 110 has been described as having four layers, the configuration of embodiments is not limited thereto. For example, according to other embodiments, the substrate 110 may include a single layer or a plurality of layers.

The buffer layer 115 may be disposed on the substrate 110. The buffer layer 115 may be disposed in the display area 10 and the pad area 30 on the substrate 110, and may have an opening that exposes a top surface of the substrate 110 disposed in the bending area 20. The buffer layer 115 may prevent metal atoms or impurities from diffusing from the substrate 110 to the semiconductor element 250, and may control a heat transfer rate during a crystallization process for forming the active layer 130 to obtain a substantially uniform active layer 130. In addition, when a surface of the substrate 110 is not uniform, the buffer layer 115 may function to improve flatness of the surface of the substrate 110. According to a type of the substrate 110, at least two buffer layers 115 may be provided on the substrate 110, or the buffer layer 115 may not be provided. The buffer layer 115 may include a silicon compound, metal oxide, and the like.

The active layer 130 may be disposed in the display area 10 on the buffer layer 115. The active layer 130 may include a metal oxide semiconductor, an inorganic semiconductor (e.g., amorphous silicon or polysilicon), an organic semiconductor, or the like. The active layer 130 may include a source region and a drain region.

The gate insulating layer 150 may be disposed in the display area 10 and the pad area 30 on the buffer layer 115 and the active layer 130. The gate insulating layer 150 may cover the active layer 130 in the display area 10 on the buffer layer 115, and may have an opening that exposes the bending area 20. For example, the gate insulating layer 150 may sufficiently cover the active layer 130 on the buffer layer 115, and may have a substantially flat top surface without creating a step (e.g., height differences) around the active layer 130. In some embodiments, the gate insulating layer 150 may be disposed along a profile of the active layer 130 with a uniform thickness to cover the active layer 130 on the buffer layer 115. The gate insulating layer 150 may include a silicon compound, metal oxide, and the like. For example, the gate insulating layer 150 may include silicon oxide (SiOx), silicon nitride (SiNx), silicon oxynitride (SiOxNy), silicon oxycarbide (SiOxCy), silicon carbonitride (SiCxNy), aluminum oxide (AlOx), aluminum nitride (AlNx), tantalum oxide (TaOx), hafnium oxide (HfOx), zirconium oxide (ZrOx), titanium oxide (TiOx), and the like. According to other embodiments, the gate insulating layer 150 may have a multilayer structure including a plurality of insulating layers. The insulating layers may have different materials from each other and different thicknesses from each other.

The first gate electrode 170 may be disposed on a portion of the gate insulating layer 150 under which the active layer

130 is disposed. The first gate electrode 170 may include a metal, an alloy, metal nitride, conductive metal oxide, a transparent conductive material, and the like. These may be used alone or in combination with each other. According to other embodiments, the first gate electrode 170 may have a multilayer structure including a plurality of metal layers. The metal layers may have different materials from each other and different thicknesses from each other.

The first interlayer insulating layer 190 may be disposed in the display area 10 and the pad area 30 on the gate insulating layer 150 and the first gate electrode 170. The first interlayer insulating layer 190 may cover the first gate electrode 170 in the display area 10 on the gate insulating layer 150, and may have an opening that exposes the bending area 20. For example, the first interlayer insulating layer 190 may sufficiently cover the first gate electrode 170 on the gate insulating layer 150, and may have a substantially flat top surface without creating a step (e.g., height differences) around the first gate electrode 170. In some embodiments, the first interlayer insulating layer 190 may be disposed along a profile (e.g., an upper surface) of the first gate electrode 170 with a uniform thickness to cover the first gate electrode 170 on the gate insulating layer 150. The first interlayer insulating layer 190 may include a silicon compound, metal oxide, and the like. According to other embodiments, the first interlayer insulating layer 190 may have a multilayer structure including a plurality of insulating layers. The insulating layers may have different materials from each other and different thicknesses from each other.

The second gate electrode 175 may be disposed on a portion of the first interlayer insulating layer 190 under which the first gate electrode 170 is disposed. In some embodiments, the first gate electrode 170 and the second gate electrode 175 may function as a storage capacitor. The second gate electrode 175 may include a metal, an alloy, metal nitride, conductive metal oxide, a transparent conductive material, and the like. These may be used alone or in combination with each other. According to other embodiments, the second gate electrode 175 may have a multilayer structure including a plurality of metal layers. The metal layers may have different materials from each other and different thicknesses from each other.

The second interlayer insulating layer 195 may be disposed in the display area 10 and the pad area 30 on the first interlayer insulating layer 190 and the second gate electrode 175. The second interlayer insulating layer 195 may cover the second gate electrode 175 in the display area 10 on the first interlayer insulating layer 190, and may have an opening that exposes the bending area 20. For example, the second interlayer insulating layer 195 may sufficiently cover the second gate electrode 175 on the first interlayer insulating layer 190, and may have a substantially flat top surface without creating a step (e.g., height differences) around the second gate electrode 175. In some embodiments, the second interlayer insulating layer 195 may be disposed along a profile (e.g., an upper surface) of the second gate electrode 175 with a uniform thickness to cover the second gate electrode 175 on the first interlayer insulating layer 190. The second interlayer insulating layer 195 may include a silicon compound, metal oxide, and the like. According to other embodiments, the second interlayer insulating layer 195 may have a multilayer structure including a plurality of insulating layers. The insulating layers may have different materials from each other and different thicknesses from each other.

The source electrode 210 and the drain electrode 230 may be disposed in the display area 10 on the second interlayer insulating layer 195. The source electrode 210 may be connected to the source region of the active layer 130 through a contact hole formed by removing one portion of the gate insulating layer 150, the first interlayer insulating layer 190, and the second interlayer insulating layer 195, and the drain electrode 230 may be connected to the drain region of the active layer 130 through a contact hole formed by removing other portions of the gate insulating layer 150, the first interlayer insulating layer 190, and the second interlayer insulating layer 195. Each of the source electrode 210 and the drain electrode 230 may include a metal, an alloy, metal nitride, conductive metal oxide, a transparent conductive material, and the like. These may be used alone or in combination with each other. According to other embodiments, each of the source electrode 210 and the drain electrode 230 may have a multilayer structure including a plurality of metal layers. The metal layers may have different materials from each other and different thicknesses from each other.

Accordingly, the semiconductor element 250 including the active layer 130, the first gate electrode 170, the second gate electrode 175, the source electrode 210, and the drain electrode 230 may be provided.

However, although the semiconductor element 250 has been described as having a top gate structure, the configuration of embodiments is not limited thereto. For example, the semiconductor element 250 may have a bottom gate structure. In addition, the configuration of the semiconductor element 250 may include the gate insulating layer 150, the first interlayer insulating layer 190, and the second interlayer insulating layer 195.

The first planarization layer 270 may be disposed on the second interlayer insulating layer 195, the source electrode 210, and the drain electrode 230. The first planarization layer 270 may cover the source electrode 210 and the drain electrode 230 in the display area 10 on the second interlayer insulating layer 195. For example, the first planarization layer 270 may have a relatively thick thickness. In some embodiments, the first planarization layer 270 may be disposed along a profile (e.g., upper surfaces) of the source electrode 210 and the drain electrode 230 with a uniform thickness on the second interlayer insulating layer 195. The first planarization layer 270 may be formed of an organic insulating material or an inorganic insulating material. According to the embodiments, the first planarization layer 270 may include an organic insulating material such as a photoresist, a polyacryl-based resin, a polyimide-based resin, a polyamide-based resin, a siloxane-based resin, an acryl-based resin, and an epoxy-based resin.

The first organic insulating layer 731 filling the opening of each of the gate insulating layer 150, the first interlayer insulating layer 190, and the second interlayer insulating layer 195 may be disposed on the substrate 110. In other words, the first organic insulating layer 731 may be disposed on a portion of a top surface of the second interlayer insulating layer 195 in the display area 10 that is adjacent to the bending area 20, the top surface of the substrate 110 disposed in the bending area 20, and a portion of the top surface of the second interlayer insulating layer 195 in the pad area 30 that is adjacent to the bending area 20. The first organic insulating layer 731 may be formed of an organic insulating material or an inorganic insulating material. According to the embodiments, the first organic insulating layer 731 may include an organic insulating material, and the first organic insulating layer 731 may include the same material as the first planarization layer 270.

The first blocking pattern 711 may be disposed between the first planarization layer 270 and the first organic insulating layer 731 on the second interlayer insulating layer 195. The first blocking pattern 711 may include an organic insulating material or an inorganic insulating material. According to the embodiments, the first blocking pattern 711 may include an organic insulating material, and the first blocking pattern 711 may include the same material as the first planarization layer 270 and the first organic insulating layer 731.

The wire pattern 215 and the connection pattern 235 may be disposed in the display area 10 on the first planarization layer 270. The wire pattern 215 may transmit a driving signal, a driving voltage, and the like. The connection pattern 235 may be connected to the drain electrode 230 through a contact hole formed by removing a portion of the first planarization layer 270, and the connection pattern 235 may electrically connect the lower electrode 290 to the drain electrode 230. Each of the wire pattern 215 and the connection pattern 235 may include a metal, an alloy, metal nitride, conductive metal oxide, a transparent conductive material, and the like. These may be used alone or in combination with each other. According to other embodiments, each of the wire pattern 215 and the connection pattern 235 may have a multilayer structure including a plurality of metal layers. For example, the metal layers may have different thicknesses from each other, or may include different materials from each other.

The second planarization layer 275 may be disposed on the first planarization layer 270, the wire pattern 215, and the connection pattern 235. The second planarization layer 275 may cover the wire pattern 215 and the connection pattern 235 in the display area 10 on the first planarization layer 270. For example, the second planarization layer 275 may have a relatively thick thickness. In some embodiments, the second planarization layer 275 may be disposed along a profile (e.g., upper surfaces) of the wire pattern 215 and the connection pattern 235 with a uniform thickness on the first planarization layer 270. The second planarization layer 275 may be formed of an organic insulating material or an inorganic insulating material.

The second organic insulating layer 732 may be disposed on the first organic insulating layer 731. In other words, the second organic insulating layer 732 may be disposed only on a top surface of the first organic insulating layer 731. In some embodiments, the second organic insulating layer 732 may cover a side surface of the first organic insulating layer 731. The second organic insulating layer 732 may be formed of an organic insulating material or an inorganic insulating material. According to the embodiments, the second organic insulating layer 732 may include an organic insulating material, and the second organic insulating layer 732 may include the same material as the second planarization layer 275.

The second blocking pattern 712 may be disposed between the second planarization layer 275 and the second organic insulating layer 732 on the first blocking pattern 711. In other words, the second blocking pattern 712 may be disposed only on a top surface of the first blocking pattern 711. In some embodiments, the second blocking pattern 712 may cover a side surface of the first blocking pattern 711. The second blocking pattern 712 may include an organic insulating material or an inorganic insulating material. According to the embodiments, the second blocking pattern 712 may include an organic insulating material, and the second blocking pattern 712 may include the same material as the second planarization layer 275 and the second organic insulating layer 732.

The lower electrode 290 may be disposed in the display area 10 on the second planarization layer 275. The lower electrode 290 may be connected to the connection pattern 235 through a contact hole formed by removing a portion of the second planarization layer 275, and the lower electrode 290 may be electrically connected to the semiconductor element 250. The lower electrode 290 may include a metal, an alloy, metal nitride, conductive metal oxide, a transparent conductive material, and the like. These may be used alone or in combination with each other. According to other embodiments, the lower electrode 290 may have a multi-layer structure including a plurality of metal layers. For example, the metal layers may have different thicknesses from each other, or may include different materials from each other.

The pixel defining layer 310 may be disposed in the display area 10 on the second planarization layer 275, and may expose a portion of a top surface of the lower electrode 290. In other words, the pixel defining layer 310 may cover both side portions (e.g., outer peripheral portions) of the lower electrode 290. The pixel defining layer 310 may be formed of an organic insulating material or an inorganic insulating material. According to the embodiments, the pixel defining layer 310 may include an organic insulating material.

The third organic insulating layer 733 may be disposed on the second organic insulating layer 732. In other words, the third organic insulating layer 733 may be disposed only on a top surface of the second organic insulating layer 732. In some embodiments, the third organic insulating layer 733 may cover the side surface of the first organic insulating layer 731 and a side surface of the second organic insulating layer 732. The third organic insulating layer 733 may be formed of an organic insulating material or an inorganic insulating material. According to the embodiments, the third organic insulating layer 733 may include an organic insulating material, and the third organic insulating layer 733 may include the same material as the pixel defining layer 310.

The third blocking pattern 713 may be disposed between the pixel defining layer 310 and the third organic insulating layer 733 on the second blocking pattern 712. In other words, the third blocking pattern 713 may be disposed only on a top surface of the second blocking pattern 712. In some embodiments, the third blocking pattern 713 may cover the side surface of the first blocking pattern 711 and a side surface of the second blocking pattern 712.

The third blocking pattern 713 may include an organic insulating material or an inorganic insulating material. According to the embodiments, the third blocking pattern 713 may include an organic insulating material, and the third blocking pattern 713 may include the same material as the pixel defining layer 310 and the third organic insulating layer 733.

Accordingly, the blocking structure 710 including the first blocking pattern 711, the second blocking pattern 712, and the third blocking pattern 713 may be provided. The blocking structure 710 may function as a dam that prevents the organic encapsulation layer 452 from leaking or overflowing in the second direction D2 during formation of the organic encapsulation layer 452. According to other embodiments, at least one dam having a structure that is similar to a structure of the blocking structure 710 may be spaced apart from the blocking structure 710 in a direction opposite to the second direction D2.

The fourth organic insulating layer 734 may be disposed on the third organic insulating layer 733. In other words, the fourth organic insulating layer 734 may be disposed only on a top surface of the third organic insulating layer 733. In some embodiments, the fourth organic insulating layer 734 may cover the side surface of the first organic insulating layer 731, the side surface of the second organic insulating layer 732, and a side surface of the third organic insulating layer 733. The fourth organic insulating layer 734 may be formed of an organic insulating material or an inorganic insulating material. According to the embodiments, the fourth organic insulating layer 734 may include an organic insulating material.

Accordingly, the organic insulating structure 730 including the first organic insulating layer 731, the second organic insulating layer 732, the third organic insulating layer 733, and the fourth organic insulating layer 734 may be provided. The organic insulating structure 730 may be disposed in the opening, and may upwardly move the neutral plane (e.g., a neutral surface or a neutral axis) of the display device 100 in the bending area 20 toward the organic insulating structure 730. For example, the connection electrodes 180 shown in FIG. 1 may be disposed between the second interlayer insulating layer 195 and the first organic insulating layer 731, between the first organic insulating layer 731 and the second organic insulating layer 732, or between the second organic insulating layer 732 and the third organic insulating layer 733. Since the organic insulating structure 730 upwardly moves the neutral plane of the display device 100 in the bending area 20, even when the bending area 20 of the display panel 200 is bent, the connection electrodes 180 that are bent may not be broken.

The light emitting layer 330 may be disposed in the display area 10 on the lower electrode 290. In other words, the light emitting layer 330 may be disposed on the lower electrode 290 exposed by the pixel defining layer 310. The light emitting layer 330 may be formed of at least one of light emitting materials for emitting different color lights (e.g., a red light, a green light, a blue light, etc.) according to a type of a sub-pixel. Alternatively, the light emitting layer 330 may be formed by stacking a plurality of light emitting materials for generating different color lights such as a red light, a green light, and a blue light to emit a white light as a whole.

The upper electrode 340 may be disposed in the display area 10 on the pixel defining layer 310 and the light emitting layer 330. The upper electrode 340 may include a metal, a metal alloy, metal nitride, conductive metal oxide, a transparent conductive material, and the like. These may be used alone or in combination with each other. According to other embodiments, the upper electrode 340 may have a multi-layer structure including a plurality of metal layers. For example, the metal layers may have different thicknesses from each other, or may include different materials from each other.

Accordingly, the display structure 500 including the lower electrode 290, the light emitting layer 330, and the upper electrode 340 may be provided.

The first inorganic thin film encapsulation layer 451 may be disposed on the upper electrode 340, the blocking structure 710, and a portion of the organic insulating structure 730. The first inorganic thin film encapsulation layer 451 may be disposed along a profile (e.g., upper surfaces) of the upper electrode 340 and the blocking structure 710 with a uniform thickness to cover the upper electrode 340 and the blocking structure 710, and may overlap the portion of the organic insulating structure 730. In some embodiments, the first inorganic thin film encapsulation layer 451 may not overlap the organic insulating structure 730. The first inorganic thin film encapsulation layer 451 may prevent the display structure 500 from deteriorating due to penetration of moisture, oxygen, and the like. In addition, the first inorganic thin film encapsulation layer 451 may perform a function of protecting the display structure 500 from an external impact. The first inorganic thin film encapsulation layer 451 may include an inorganic insulating material having flexibility.

The organic encapsulation layer 452 may be disposed on the first inorganic thin film encapsulation layer 451. The organic encapsulation layer 452 may improve flatness of the display device 100, and may protect the display structure 500 together with the first inorganic thin film encapsulation layer 451. The organic encapsulation layer 452 may include an organic insulating material having flexibility.

The second inorganic thin film encapsulation layer 453 may be disposed on the organic encapsulation layer 452 and the first inorganic thin film encapsulation layer 451. The second inorganic thin film encapsulation layer 453 may be disposed along a profile (e.g., upper surfaces) of the organic encapsulation layer 452 and the first inorganic thin film encapsulation layer 451 with a uniform thickness to cover the organic encapsulation layer 452 and the first inorganic thin film encapsulation layer 451, and may overlap a portion of the organic insulating structure 730. In some embodiments, the second inorganic thin film encapsulation layer 453 may not overlap the organic insulating structure 730. The second inorganic thin film encapsulation layer 453 may prevent the display structure 500 from deteriorating due to the penetration of moisture, oxygen, and the like together with the first inorganic thin film encapsulation layer 451. In addition, the second inorganic thin film encapsulation layer 453 may perform a function of protecting the display structure 500 from an external impact together with the first inorganic thin film encapsulation layer 451 and the organic encapsulation layer 452. The second inorganic thin film encapsulation layer 453 may include the inorganic insulating material having flexibility.

Accordingly, the thin film encapsulation structure 450 including the first inorganic thin film encapsulation layer 451, the organic encapsulation layer 452, and the second inorganic thin film encapsulation layer 453 may be provided.

According to other embodiments, the thin film encapsulation structure 450 may have a five-layer structure in which three inorganic thin film encapsulation layers and two organic encapsulation layers are stacked, or a seven-layer structure in which four inorganic thin film encapsulation layers and three organic encapsulation layers are stacked.

The sensing connection electrode 386 may be disposed in the display area 10 on the second inorganic thin film encapsulation layer 453. As shown in FIG. 8, the sensing connection electrode 386 may electrically connect two second sensing electrodes 384, which are adjacent to each other in the first direction D1, through contact holes. For example, the contact holes formed in the first insulating layer 392 may be shown in another sectional view of the display device 100.

The first insulating layer 392 may be disposed on the second inorganic thin film encapsulation layer 453 and the sensing connection electrode 386. The first insulating layer 392 may cover the sensing connection electrode 386, and may have contact holes that expose parts of the sensing connection electrode 386 overlapping parts of the two adjacent second sensing electrodes 384, respectively. For example, the first insulating layer 392 may sufficiently cover the sensing connection electrode 386 on the second inorganic thin film encapsulation layer 453, and may have a substantially flat top surface without creating a step (e.g., height differences) around the sensing connection electrode 386. In some embodiments, the first insulating layer 392 may be disposed along a profile (e.g., an upper surface) of the sensing connection electrode 386 with a uniform thickness to cover the sensing connection electrode 386 on the second inorganic thin film encapsulation layer 453. The first insulating layer 392 may include an organic insulating material or an inorganic insulating material. According to the embodiments, the first insulating layer 392 may be formed of an inorganic insulating material. According to other embodiments, the first insulating layer 392 may extend in the second direction D2 so as to be interposed between the organic insulating structure 730 and the first shielding layer 630. In this case, the first shielding layer 630 may include the same material as the first sensing electrode 382 or the second sensing electrode 384.

First sensing electrodes 382 and second sensing electrodes 384 may be disposed on the first insulating layer 392. In other words, the first sensing electrodes 382 and the second sensing electrodes 384 may be disposed between the first insulating layer 392 and the second insulating layer 394. As shown in FIG. 8, each of the first sensing electrodes 382 may extend in the second direction D2, and may be spaced apart from each other in the first direction D1. The second sensing electrodes 384 may be spaced apart from each other in the second direction D2 between two adjacent first sensing electrodes 382 among the first sensing electrodes 382. For example, the second sensing electrode 384 may be shown in another sectional view of the display device 100, and the second sensing electrode 384 may be connected to the sensing connection electrode 386 through the contact holes.

According to the embodiments, each of the sensing connection electrode 386, the first sensing electrode 382, and the second sensing electrode 384 may have a multilayer structure in which Ti/Al/Ti are stacked, and may be substantially transparent. According to other embodiments, each of the sensing connection electrode 386, the first sensing electrode 382, and the second sensing electrode 384 may include a carbon nanotube (CNT), transparent conductive oxide, ITO, indium gallium zinc oxide (IGZO), ZnO, graphene, a silver nanowire (Ag nanowire; AgNW), Cu, Cr, and the like.

The second insulating layer 394 may be disposed on the first insulating layer 392, the first sensing electrode 382, and the second sensing electrode 384, and the second insulating layer 394 may cover the first sensing electrode 382 and the second sensing electrode 384. For example, the second insulating layer 394 may sufficiently cover the first sensing electrode 382 and the second sensing electrode 384 on the first insulating layer 392, and may have a substantially flat top surface without creating a step (e.g., height differences) around the first sensing electrode 382 and the second sensing electrode 384. In some embodiments, the second insulating layer 394 may be disposed along a profile (e.g., upper surfaces) of the first sensing electrode 382 and the second sensing electrode 384 with a uniform thickness to cover the first sensing electrode 382 and the second sensing electrode 384 on the first insulating layer 392. The second insulating layer 394 may include an inorganic insulating material or an organic insulating material. According to the embodiments, the second insulating layer 394 may include an organic insulating material. According to other embodiments, the second insulating layer 394 may extend in the second direction D2 so as to be disposed on the first shielding layer 630.

Accordingly, the sensing structure 380 including the sensing connection electrode 386, the first sensing electrode 382, the second sensing electrode 384, the first insulating layer 392, and the second insulating layer 394 may be provided. The sensing structure 380 may detect a portion of a body of a user, an object, and the like disposed over a front surface of the display device 100 through the connection electrode 386, the first sensing electrode 382, and the second sensing electrode 384. According to the embodiments, the connection electrode 386, the first sensing electrode 382, and the second sensing electrode 384 may include a proximity sensor electrode configured to detect proximity with respect to the user or the object disposed over the front surface of the display device 100, or a touch sensor electrode configured to detect contact of the portion of the body of the user. According to other embodiments, the sensing connection electrode 386 may be disposed on the first sensing electrode 382 and the second sensing electrode 384.

The organic insulating pattern 490 may be disposed in the display area 10 that is adjacent to the bending area 20 and at least a portion of the bending area 20. In some embodiments, the organic insulating pattern 490 may not be disposed in the bending area 20. The organic insulating pattern 490 may assist formation of the polarizing film 430 by planarizing an uneven surface in the display area 10 that is adjacent to the bending area 20. In other words, the organic insulating pattern 490 may be disposed on the second inorganic thin film encapsulation layer 453 with a relatively thick thickness. The organic insulating pattern 490 may include an organic insulating material.

Accordingly, the display panel 200 including the substrate 110, the buffer layer 115, the gate insulating layer 150, the first interlayer insulating layer 190, the second interlayer insulating layer 195, the semiconductor element 250, the first planarization layer 270, the second planarization layer 275, the wire pattern 215, the connection pattern 235, the pixel defining layer 310, the display structure 500, the thin film encapsulation structure 450, the sensing structure 380, the blocking structure 710, the organic insulating structure 730, and the organic insulating pattern 490 may be provided.

The first shielding layer 630 may be disposed in a portion of the display area 10, the bending area 20, and a portion of the pad area 30 on the substrate 110. In other words, the first shielding layer 630 may be disposed on the organic insulating structure 730 and the second interlayer insulating layer 195 disposed in the pad area 30, and a portion of the first shielding layer 630 may be disposed on a top surface of the organic insulating structure 730. In addition, the first shielding layer 630 may be disposed on the connection electrodes 180, and may cover the connection electrodes 180 (see FIG. 1). The first shielding layer 630 may reflect or absorb the RF signal (e.g., the RF signal within the low frequency band or noise signal) generated by the antenna 650. In other words, when the first shielding layer 630 is provided, the RF signal may not be transmitted to the connection electrodes 180. For example, the RF signal may affect a driving signal applied to the connection electrodes 180, and the first shielding layer 630 may shield the RF signal so that the driving signal may not be affected or interfered by the RF signal.

As shown in FIG. 7, the first shielding layer 630 may have a structure in which a first metal layer 631, a second metal layer 632, and a third metal layer 633 are sequentially stacked. For example, the first metal layer 631 may include Ti. In addition, the second metal layer 632 may be disposed on the first metal layer 631, and may include Al. Furthermore, the third metal layer 633 may be disposed on the second metal layer 632, and may include Ti. According to the embodiments, the first shielding layer 630 may include the same material as the sensing connection electrode 386, the first sensing electrode 382, or the second sensing electrode 384. In this case, the first shielding layer 630 may not be electrically connected to the sensing connection electrode 386, the first sensing electrode 382, or the second sensing electrode 384. In some embodiments, the first shielding layer 630 may extend in the direction opposite to the second direction D2 so as to overlap a portion of the blocking structure 710.

However, although the first shielding layer 630 has been described as including three layers, the configuration of embodiments is not limited thereto. For example, according to other embodiments, the first shielding layer 630 may include a single layer or a plurality of layers. For example, when a metal layer having a relatively thick thickness is required to shield the RF signal, the first shielding layer 630 may have a six-layer structure (e.g., Ti/Al/Ti/Ti/Al/Ti) in which the sensing connection electrode 386 and the first sensing electrode 382 (or the second sensing electrode 384) are combined.

The polarizing film 430 may be disposed on the sensing structure 380 and the organic insulating pattern 490, and the bending protection layer 460 may be disposed on a portion of the organic insulating pattern 490 and the first shielding layer 630. In addition, the lower protective film 510 may be disposed on the bottom surface of the substrate 110, and the lower protective film 510 may not be disposed on the bottom surface of the substrate 110 disposed in the bending area 20.

However, although the display device 100 according to the embodiment has been described as specifically being an organic light emitting diode display device, the configuration of embodiments is not limited thereto. According to other embodiments, the display device 100 may include a liquid crystal display device (LCD), a field emission display device (FED), a plasma display device (PDP), or an electrophoretic display device (EPD).

FIGS. 9 to 19 are cross-sectional views illustrating a method of manufacturing a display device according to embodiments.

Figure 9:
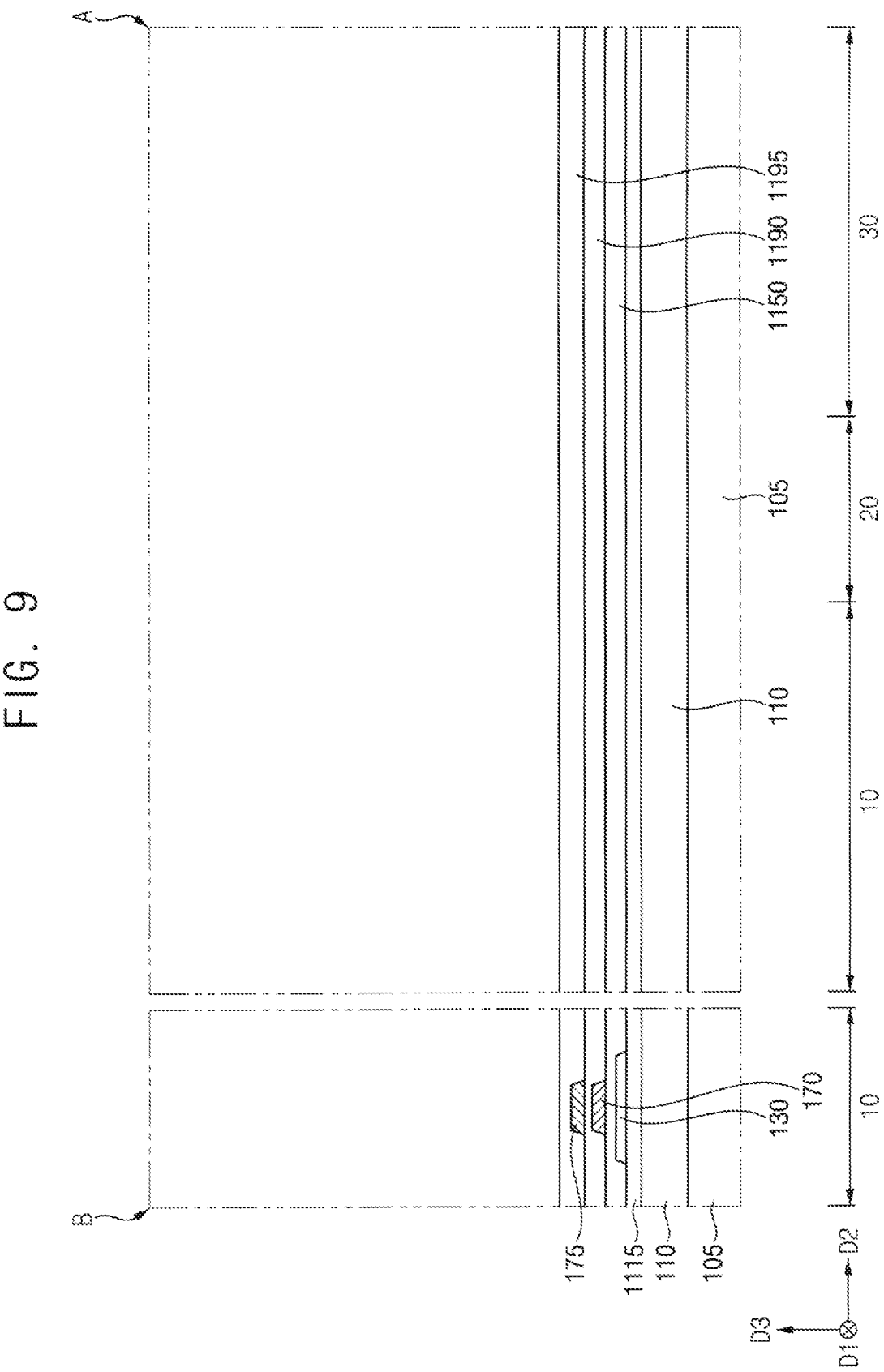

Referring to FIG. 9, a rigid glass substrate 105 may be provided. A substrate 110 including transparent or opaque materials may be formed on the glass substrate 105. The substrate 110 may be configured as a transparent resin substrate. Examples of the transparent resin substrate that may be used as the substrate 110 include a polyimide substrate. In this case, the polyimide substrate may include a first polyimide layer, a first barrier film layer, a second polyimide layer, a second barrier film layer, and the like. The substrate 110 may be divided into a display area 10, a bending area 20, and a pad area 30.

For example, since the substrate 110 is thin and flexible, the substrate 110 may be formed on the rigid glass substrate 105 to support formation of an upper structure such as a semiconductor element, a display structure, and a thin film encapsulation structure, which will be formed in a subsequent process. For example, after a buffer layer is formed on the second barrier film layer, the upper structure may be formed on the buffer layer. After the formation of the upper structure, the glass substrate 105 may be removed. In other words, due to flexible physical properties of the substrate 110, it may be difficult to directly form the upper structure on the substrate 110. When taking the above point into consideration, the upper structure may be formed by using the rigid glass substrate 105, and the glass substrate may be removed, so that the first polyimide layer, the first barrier film layer, the second polyimide layer, and the second barrier film layer may be used as the substrate 110.

A preliminary buffer layer 1115 may be formed on the substrate 110. The preliminary buffer layer 1115 may be formed over the whole substrate 110. The preliminary buffer layer 1115 may function to improve flatness of a surface of the substrate 110 when the surface of the substrate 110 is not uniform. The preliminary buffer layer 1115 may be formed of a silicon compound, metal oxide, and the like.

An active layer 130 may be formed in the display area 10 on the preliminary buffer layer 1115. The active layer 130 may be formed of a metal oxide semiconductor, an inorganic semiconductor, an organic semiconductor, or the like. The active layer 130 may include a source region and a drain region.

A preliminary gate insulating layer 1150 may be formed on the preliminary buffer layer 1115 and the active layer 130. The preliminary gate insulating layer 1150 may cover the active layer 130 in the display area 10 on the preliminary buffer layer 1115, and may extend in the second direction D2 that is a direction from the display area 10 to the pad area 30. The preliminary gate insulating layer 1150 may be formed of a silicon compound, metal oxide, and the like. For example, the preliminary gate insulating layer 1150 may include $SiO_x$, $SiN_x$, $SiO_xN_y$, $SiO_xC_y$, $SiC_xN_y$, $AlO_x$, $AlN_x$, $TaO_x$, $HfO_x$, $ZrO_x$, $TiO_x$, and the like.

A first gate electrode 170 may be formed on a portion of the preliminary gate insulating layer 1150 under which the active layer 130 is disposed. The first gate electrode 170 may be formed of a metal, an alloy, metal nitride, conductive metal oxide, a transparent conductive material, and the like. These may be used alone or in combination with each other.

A preliminary first interlayer insulating layer 1190 may be formed on the preliminary gate insulating layer 1150 and the first gate electrode 170. The preliminary first interlayer insulating layer 1190 may cover the first gate electrode 170 in the display area 10 on the preliminary gate insulating layer 1150, and may extend in the second direction D2. The preliminary first interlayer insulating layer 1190 may be formed of a silicon compound, metal oxide, and the like.

A second gate electrode 175 may be formed on a portion of the preliminary first interlayer insulating layer 1190 under which the first gate electrode 170 is disposed. The second gate electrode 175 may be formed of a metal, an alloy, metal nitride, conductive metal oxide, a transparent conductive material, and the like. These may be used alone or in combination with each other.

A preliminary second interlayer insulating layer 1195 may be formed on the preliminary first interlayer insulating layer 1190 and the second gate electrode 175. The preliminary second interlayer insulating layer 1195 may cover the second gate electrode 175 in the display area 10 on the preliminary first interlayer insulating layer 1190, and may extend in the second direction D2. The preliminary second interlayer insulating layer 1195 may be formed of a silicon compound, metal oxide, and the like.

Figure 10:
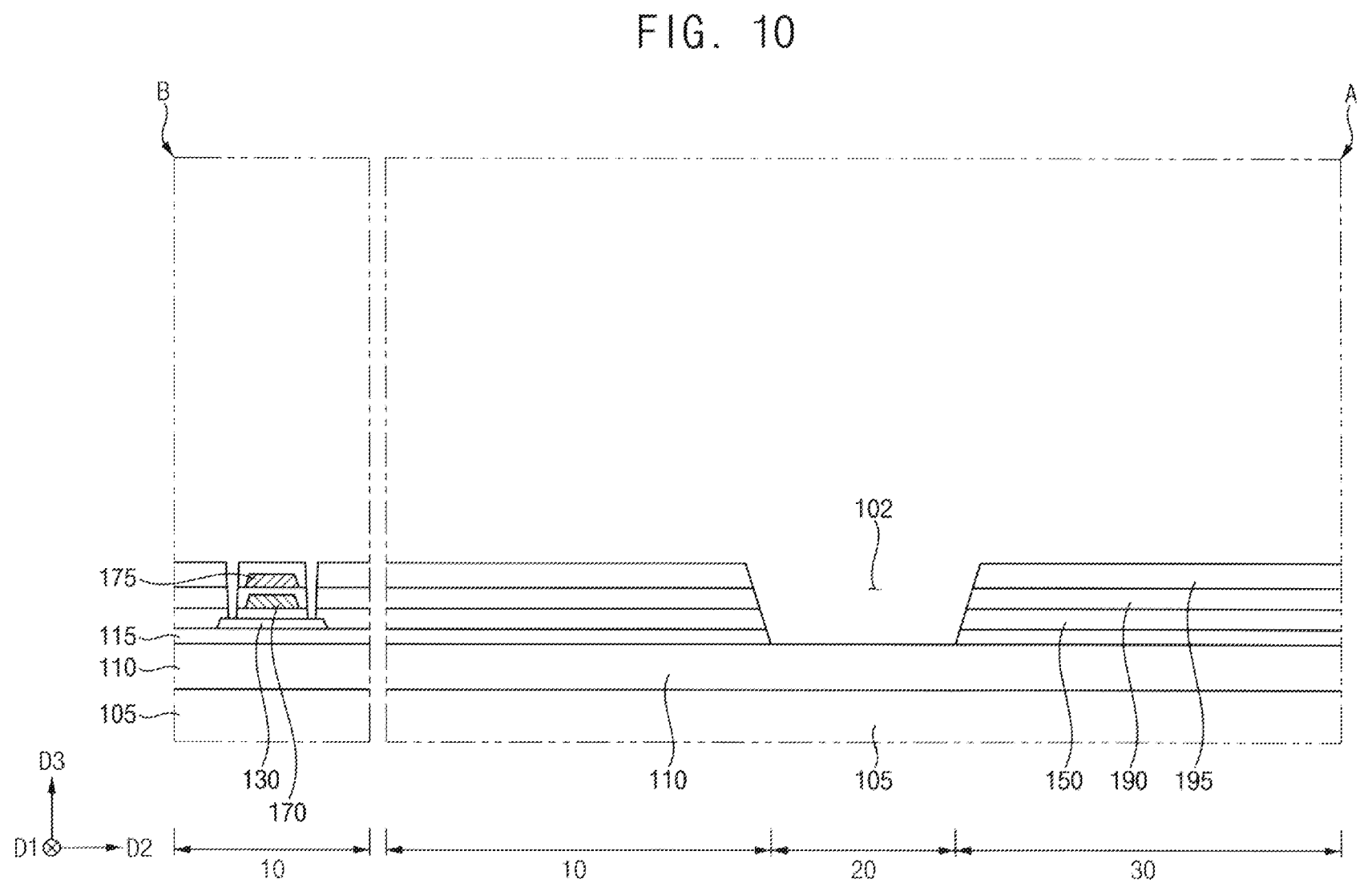

Referring to FIG. 10, in the display area 10, a first contact hole may be formed by removing first portions of the preliminary gate insulating layer 1150, the preliminary first interlayer insulating layer 1190, and the preliminary second interlayer insulating layer 1195, and a second contact hole may be formed by removing second portions of the preliminary gate insulating layer 1150, the preliminary first interlayer insulating layer 1190, and the preliminary second interlayer insulating layer 1195. The first contact hole may expose the source region of the active layer 130, and the second contact hole may expose the drain region of the active layer 130.

While the first and second contact holes are formed, the preliminary buffer layer 1115, the preliminary gate insulating layer 1150, the preliminary first interlayer insulating layer 1190, and the preliminary second interlayer insulating layer 1195 disposed in the bending area 20 may be removed, and an opening 102 that exposes a top surface of the substrate 110 may be formed. Since the opening 102 is formed, the preliminary buffer layer 1115 may be defined as a buffer layer 115 having an opening that exposes the bending area 20, the preliminary gate insulating layer 1150 may be defined as a gate insulating layer 150 having an opening that exposes the bending area 20, the preliminary first interlayer insulating layer 1190 may be defined as a first interlayer insulating layer 190 having an opening that exposes the bending area 20, and the preliminary second interlayer insulating layer 1195 may be defined as a second interlayer insulating layer 195 having an opening that exposes the bending area 20.

Figure 11:
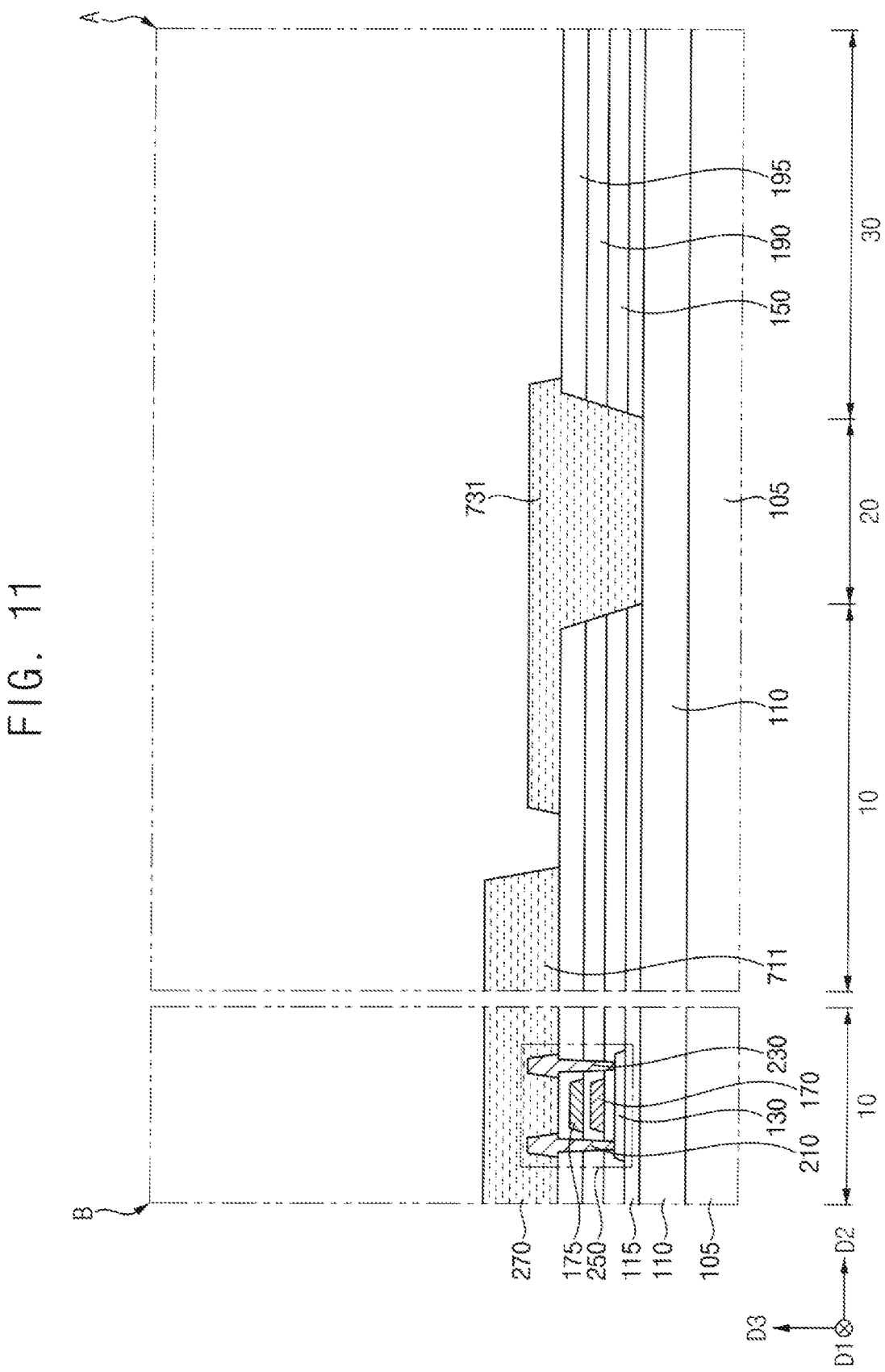

Referring to FIG. 11, a source electrode 210 and a drain electrode 230 may be formed in the display area 10 on the second interlayer insulating layer 195. The source electrode 210 may fill the first contact hole so as to be connected to the source region of the active layer 130, and the drain electrode 230 may fill the second contact hole so as to be connected to the drain region of the active layer 130. Each of the source electrode 210 and the drain electrode 230 may be formed of a metal, an alloy, metal nitride, conductive metal oxide, a transparent conductive material, and the like. These may be used alone or in combination with each other.

Accordingly, a semiconductor element 250 including the active layer 130, the first gate electrode 170, the second gate electrode 175, the source electrode 210, and the drain electrode 230 may be formed.

Referring to FIG. 1, when connection electrodes 180 are formed between the second interlayer insulating layer 195 and a first organic insulating layer 731, the connection electrodes 180 may be simultaneously formed with the source electrode 210 and the drain electrode 230 by using the same material as the source electrode 210 and the drain electrode 230. In addition, a pad electrode 470 formed in the pad area 30 may be simultaneously formed with the first gate electrode 170, the second gate electrode 175, the source electrode 210, or the drain electrode 230 during a process of forming the first gate electrode 170, the second gate electrode 175, the source electrode 210, or the drain electrode 230.

Referring again to FIG. 11, a first planarization layer 270 may be formed on the second interlayer insulating layer 195, the source electrode 210, and the drain electrode 230. The first planarization layer 270 may cover the source electrode 210 and the drain electrode 230 in the display area 10 on the second interlayer insulating layer 195. For example, the first planarization layer 270 may have a relatively thick thickness. In this case, the first planarization layer 270 may have a substantially flat top surface. In order to implement such a flat top surface of the first planarization layer 270, a planarization process may be additionally performed on the first planarization layer 270. The first planarization layer 270 may be formed of an organic insulating material.

A first organic insulating layer 731 filling the opening 102 may be formed on the substrate 110. In other words, the first organic insulating layer 731 may be formed on a portion of a top surface of the second interlayer insulating layer 195 in the display area 10 that is adjacent to the bending area 20, the top surface of the substrate 110 disposed in the bending area 20, and a portion of the top surface of the second interlayer insulating layer 195 in the pad area 30 that is adjacent to the bending area 20.

A first blocking pattern 711 may be formed between the first planarization layer 270 and the first organic insulating layer 731 on the second interlayer insulating layer 195. According to embodiments, the first organic insulating layer 731 and the first blocking pattern 711 may be simultaneously formed with the first planarization layer 270 by using the same material as the first planarization layer 270.

Figure 12:
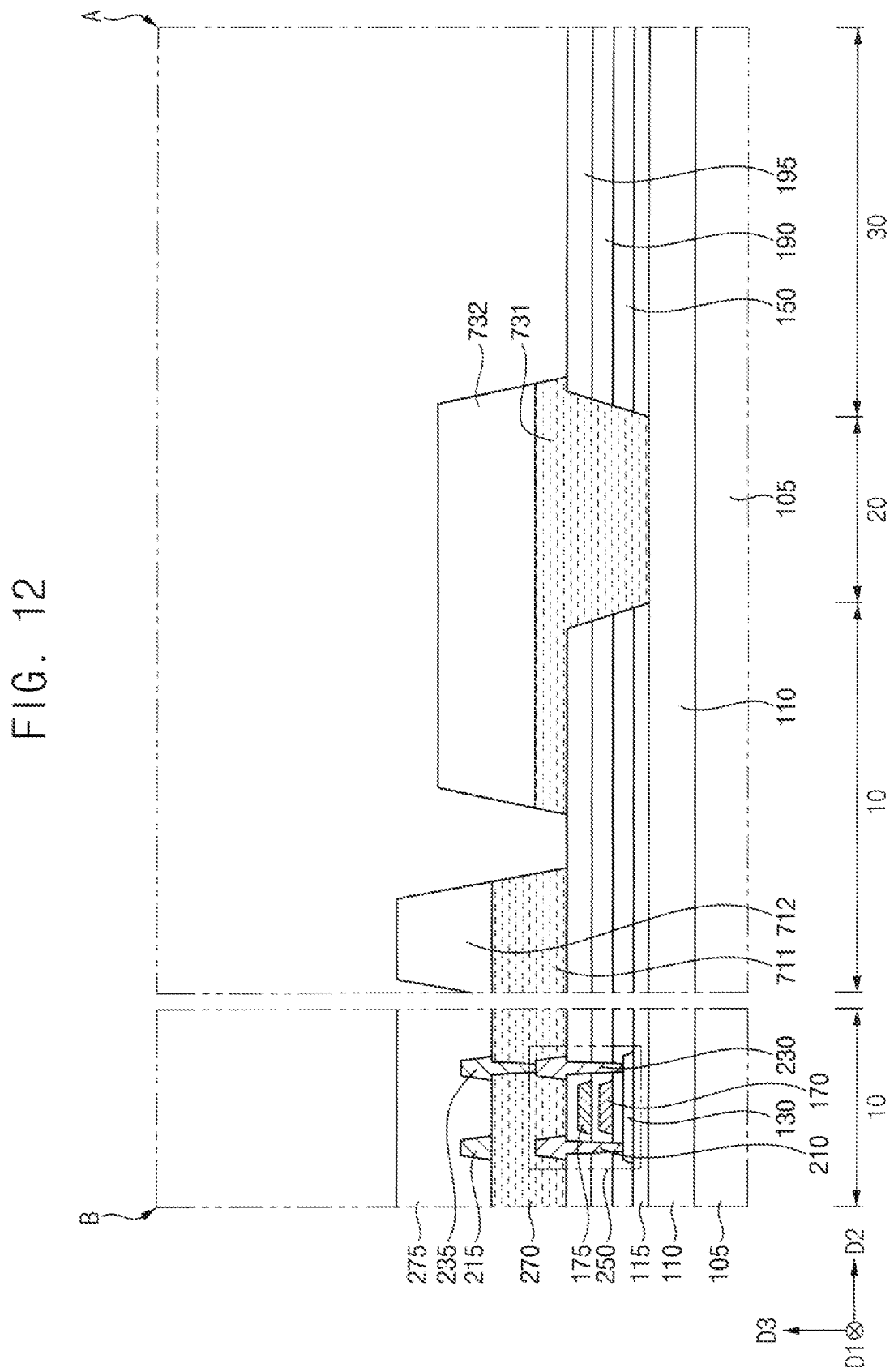

Referring to FIG. 12, a wire pattern 215 and a connection pattern 235 may be formed in the display area 10 on the first planarization layer 270. The connection pattern 235 may be connected to the drain electrode 230 through a contact hole formed by removing a portion of the first planarization layer 270. Each of the wire pattern 215 and the connection pattern 235 may be formed of a metal, an alloy, metal nitride, conductive metal oxide, a transparent conductive material, and the like. These may be used alone or in combination with each other.

Referring to FIG. 1, when the connection electrodes 180 are formed between the first organic insulating layer 731 and the second organic insulating layer 732, the connection electrodes 180 may be simultaneously formed with the wire pattern 215 and the connection pattern 235 by using the same material as the wire pattern 215 and the connection pattern 235.

Referring again to FIG. 12, a second planarization layer 275 may be formed on the first planarization layer 270, the wire pattern 215, and the connection pattern 235. The second planarization layer 275 may cover the wire pattern 215 and the connection pattern 235 in the display area 10 on the first planarization layer 270. For example, the second planarization layer 275 may have a relatively thick thickness. In this case, the second planarization layer 275 may have a substantially flat top surface. In order to implement such a flat top surface of the second planarization layer 275, a planarization process may be additionally performed on the second planarization layer 275. The second planarization layer 275 may be formed of an organic insulating material.

A second organic insulating layer 732 may be formed on the first organic insulating layer 731, and a second blocking pattern 712 may be formed between the second planarization layer 275 and the second organic insulating layer 732 on the first blocking pattern 711. According to the embodiments, the second organic insulating layer 732 and the second blocking pattern 712 may be simultaneously formed with the second planarization layer 275 by using the same material as the second planarization layer 275.

Figure 13:
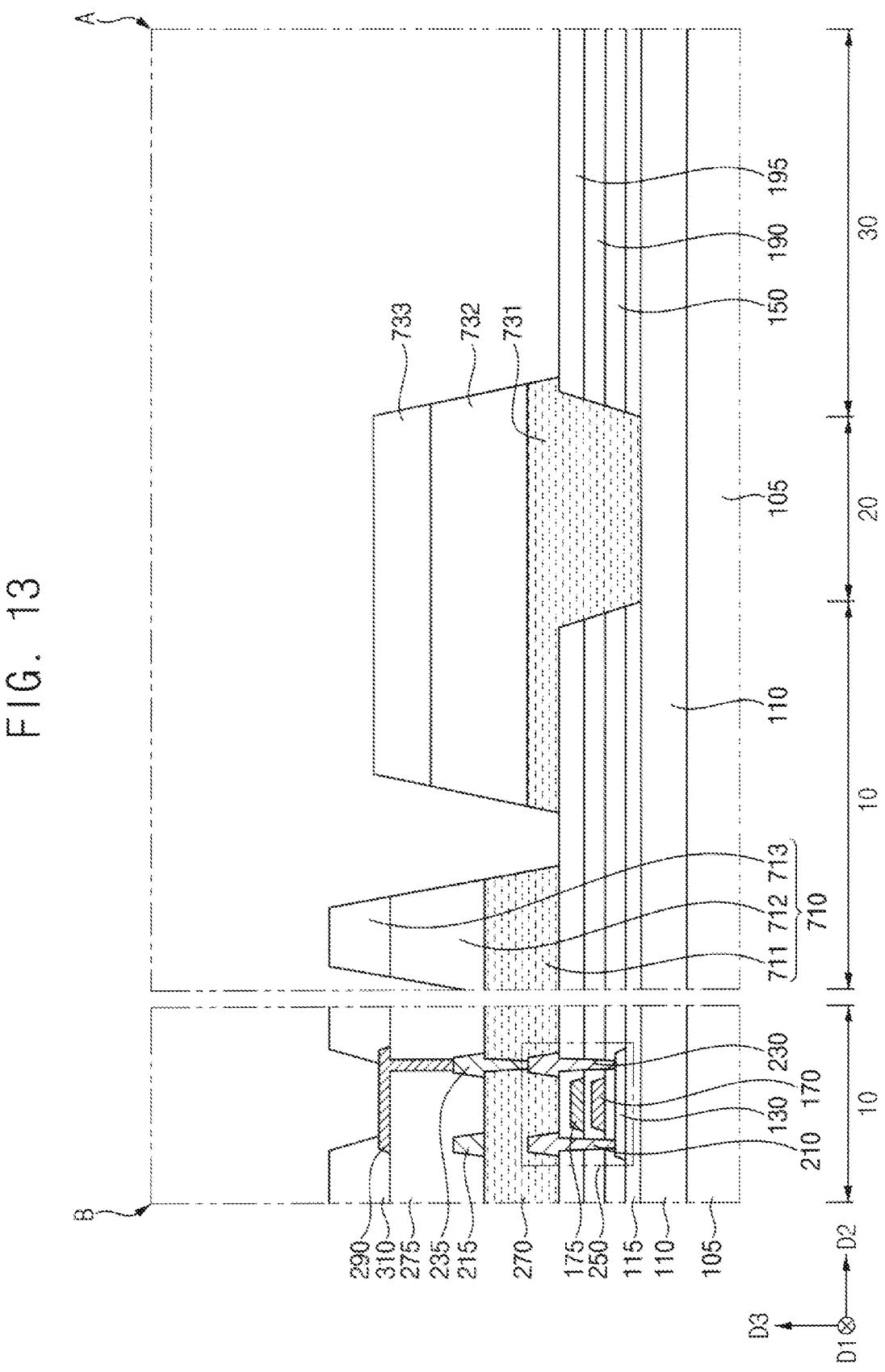

Referring to FIG. 13, a lower electrode 290 may be formed in the display area 10 on the second planarization layer 275. The lower electrode 290 may be connected to the connection pattern 235 through a contact hole formed by removing a portion of the second planarization layer 275. The lower electrode 290 may be formed of a metal, an alloy, metal nitride, conductive metal oxide, a transparent conductive material, and the like. These may be used alone or in combination with each other.

Referring to FIG. 1, when the connection electrodes 180 are formed between the second organic insulating layer 732 and the third organic insulating layer 733, the connection electrodes 180 may be simultaneously formed with the lower electrode 290 by using the same material as the lower electrode 290.

Referring again to FIG. 13, a pixel defining layer 310 may be formed in the display area 10 on the second planarization layer 275, and may expose a portion of a top surface of the lower electrode 290. The pixel defining layer 310 may be formed of an organic insulating material.

A third organic insulating layer 733 may be formed on the second organic insulating layer 732, and a third blocking pattern 713 may be formed between the pixel defining layer 310 and the third organic insulating layer 733 on the second blocking pattern 712. According to the embodiments, the third organic insulating layer 733 and the third blocking pattern 713 may be simultaneously formed with the pixel defining layer 310 by using the same material as the pixel defining layer 310.

Accordingly, a blocking structure 710 including the first blocking pattern 711, the second blocking pattern 712, and the third blocking pattern 713 may be formed.

Figure 14:
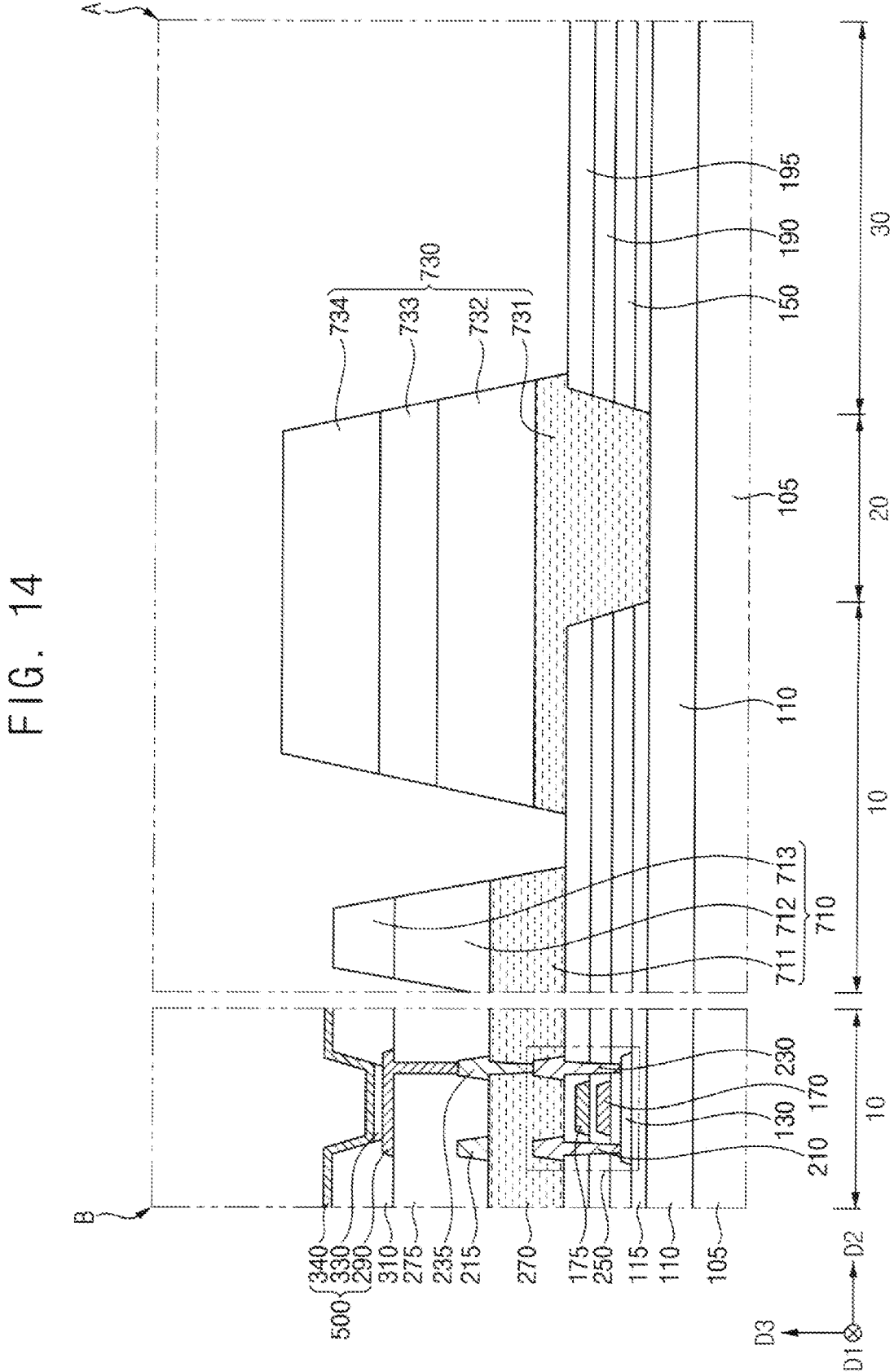

Referring to FIG. 14, a fourth organic insulating layer 734 may be formed on the third organic insulating layer 733. The fourth organic insulating layer 734 may be formed of an organic insulating material.

Accordingly, an organic insulating structure 730 including the first organic insulating layer 731, the second organic insulating layer 732, the third organic insulating layer 733, and the fourth organic insulating layer 734 may be formed.

A light emitting layer 330 may be formed in the display area 10 on the lower electrode 290. The light emitting layer 330 may be formed of at least one of light emitting materials for emitting different color lights according to a type of a sub-pixel.

An upper electrode 340 may be formed in the display area 10 on the pixel defining layer 310 and the light emitting layer 330. The upper electrode 340 may be formed of a metal, a metal alloy, metal nitride, conductive metal oxide, a transparent conductive material, and the like. These may be used alone or in combination with each other.

Accordingly, a display structure 500 including the lower electrode 290, the light emitting layer 330, and the upper electrode 340 may be formed.

Figure 15:
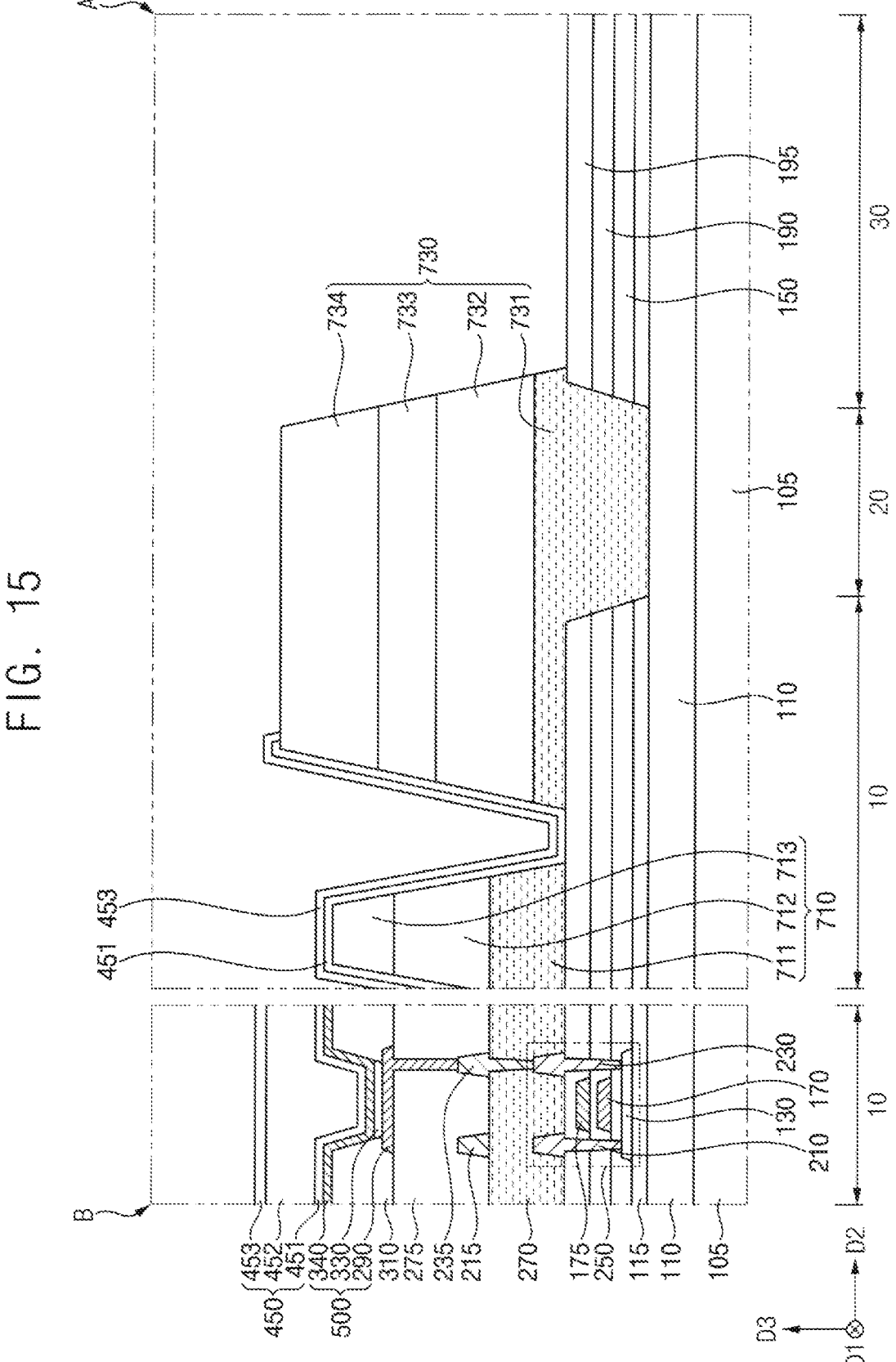

Referring to FIG. 15, a first inorganic thin film encapsulation layer 451 may be formed on the upper electrode 340, the blocking structure 710, and a portion of the organic insulating structure 730. The first inorganic thin film encapsulation layer 451 may be formed along a profile (e.g., upper surfaces) of the upper electrode 340 and the blocking structure 710 with a uniform thickness to cover the upper electrode 340 and the blocking structure 710, and may overlap the portion of the organic insulating structure 730. The first inorganic thin film encapsulation layer 451 may be formed of an inorganic insulating material having flexibility.

An organic encapsulation layer 452 may be formed on the first inorganic thin film encapsulation layer 451. The organic encapsulation layer 452 may be formed of an organic insulating material having flexibility.

A second inorganic thin film encapsulation layer 453 may be formed on the organic encapsulation layer 452 and the first inorganic thin film encapsulation layer 451. The second inorganic thin film encapsulation layer 453 may be disposed along a profile (e.g., upper surfaces) of the organic encapsulation layer 452 and the first inorganic thin film encapsulation layer 451 with a uniform thickness to cover the organic encapsulation layer 452 and the first inorganic thin film encapsulation layer 451, and may overlap a portion of the organic insulating structure 730. The second inorganic thin film encapsulation layer 453 may be formed of the inorganic insulating material having flexibility.

Accordingly, a thin film encapsulation structure 450 including the first inorganic thin film encapsulation layer 451, the organic encapsulation layer 452, and the second inorganic thin film encapsulation layer 453 may be formed.

Figure 16:
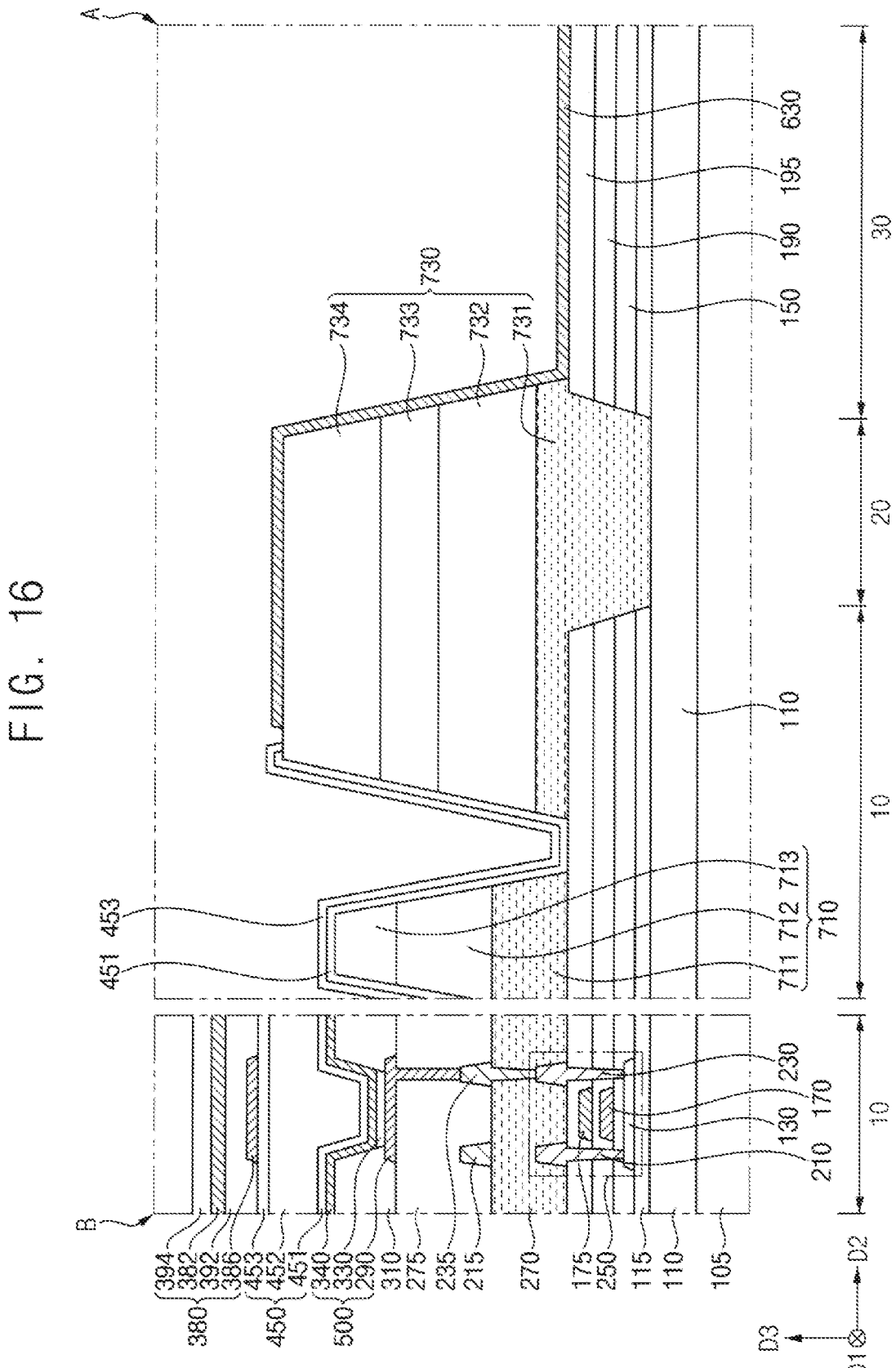

Referring to FIGS. 8 and 16, a sensing connection electrode 386 may be formed in the display area 10 on the second inorganic thin film encapsulation layer 453.

A first insulating layer 392 may be formed on the second inorganic thin film encapsulation layer 453 and the sensing connection electrode 386. The first insulating layer 392 may cover the sensing connection electrode 386. The first insulating layer 392 may be formed of an inorganic insulating material.

First sensing electrodes 382 and second sensing electrodes 384 may be formed on the first insulating layer 392. Each of the first sensing electrodes 382 may extend in the second direction D2, and may be spaced apart from each other in the first direction D1. The second sensing electrodes 384 may be spaced apart from each other in the second direction D2 between two adjacent first sensing electrodes 382 among the first sensing electrodes 382.

According to the embodiments, each of the sensing connection electrode 386, the first sensing electrode 382, and the second sensing electrode 384 may have a multilayer structure in which Ti/Al/Ti are stacked, and may be substantially transparent. According to other embodiments, each of the sensing connection electrode 386, the first sensing electrode 382, and the second sensing electrode 384 may be formed of a CNT, transparent conductive oxide, ITO, IGZO, ZnO, graphene, an AgNW, Cu, Cr, and the like.

A second insulating layer 394 may be formed on the first insulating layer 392, the first sensing electrode 382, and the second sensing electrode 384, and the second insulating layer 394 may cover the first sensing electrode 382 and the second sensing electrode 384. The second insulating layer 394 may be formed of an organic insulating material.

Accordingly, a sensing structure 380 including the sensing connection electrode 386, the first sensing electrode 382, the second sensing electrode 384, the first insulating layer 392, and the second insulating layer 394 may be formed. According to other embodiments, a plurality of openings may be formed in each of the sensing connection electrode 386, the first sensing electrode 382, and the second sensing electrode 384, and each of the openings may overlap the lower electrode 290. In some embodiments, each of the sensing connection electrode 386, the first sensing electrode 382, and the second sensing electrode 384 may not overlap the lower electrode 290.

A first shielding layer 630 may be formed in a portion of the display area 10, the bending area 20, and a portion of the pad area 30 on the substrate 110. In other words, the first shielding layer 630 may be formed on the organic insulating structure 730 and the second interlayer insulating layer 195 disposed in the pad area 30, and a portion of the first shielding layer 630 may be formed on a top surface of the organic insulating structure 730. In addition, the first shielding layer 630 may be formed on the connection electrodes 180, and may cover the connection electrodes 180 (see FIG. 1).

As shown in FIG. 7, the first shielding layer 630 may have a structure in which a first metal layer 631, a second metal layer 632, and a third metal layer 633 are sequentially stacked. For example, the first metal layer 631 may be formed of Ti. In addition, the second metal layer 632 may be formed on the first metal layer 631, and may be formed of Al. Furthermore, the third metal layer 633 may be formed on the second metal layer 632, and may be formed of Ti. According to the embodiments, the first shielding layer 630 may be formed simultaneously with the sensing connection electrode 386 by using the same material as the sensing connection electrode 386, or may be formed simultaneously with the first sensing electrode 382 and the second sensing electrode 384 by using the same material as the first sensing electrode 382 and the second sensing electrode 384.

Figure 17:
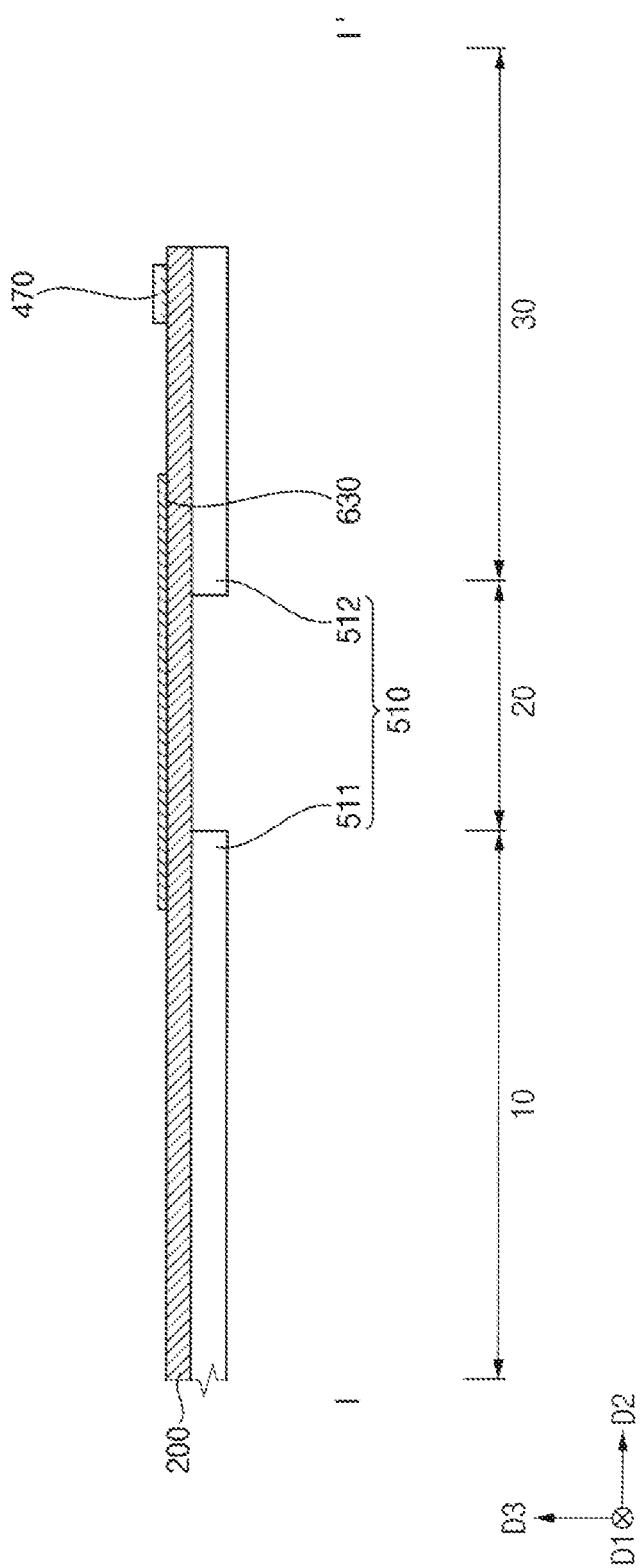

Referring to FIGS. 6 and 17, an organic insulating pattern 490 may be formed in the display area 10 that is adjacent to the bending area 20 and at least a portion of the bending area 20. The organic insulating pattern 490 may be formed on the second inorganic thin film encapsulation layer 453 with a relatively thick thickness. In this case, the organic insulating pattern 490 may have a substantially flat top surface. In order to implement such a flat top surface of the organic insulating pattern 490, a planarization process may be additionally performed on the organic insulating pattern 490. The organic insulating pattern 490 may be formed of an organic material.

After the organic insulating pattern 490 is formed, the glass substrate 105 may be peeled off from the substrate 110.

Accordingly, a display panel 200 including the substrate 110, the buffer layer 115, the gate insulating layer 150, the first interlayer insulating layer 190, the second interlayer insulating layer 195, the semiconductor element 250, the first planarization layer 270, the second planarization layer 275, the wire pattern 215, the connection pattern 235, the pixel defining layer 310, the display structure 500, the thin film encapsulation structure 450, the sensing structure 380, the blocking structure 710, the organic insulating structure 730, and the organic insulating pattern 490 may be provided.

A lower protective film 510 may be formed on a bottom surface of the display panel 200. For example, a first protective film 511 may be formed in the display area 10 on the bottom surface of the display panel 200, and a second protective film 512 may be formed in the pad area 30 on the bottom surface of the display panel 200. The lower protective film 510 may be formed of an organic insulating material. In some embodiments, the lower protective film 510 may be formed of PET, PEN, PP, PC, PS, PSul, PE, PPA, PES, PAR, PCO, MPPO, and the like.

Figure 18:
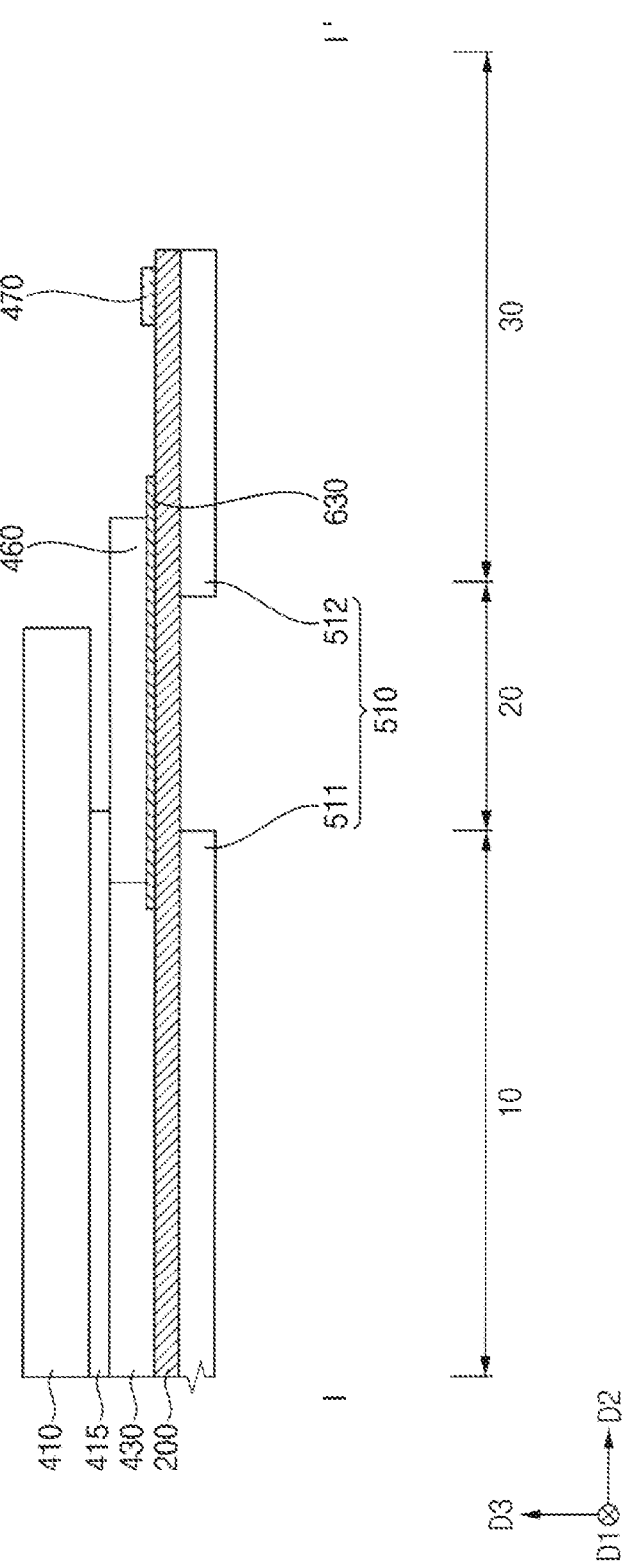

Referring to FIGS. 6 and 18, a polarizing film 430 may be formed in the display area 10 on the display panel 200. According to the embodiments, a portion of the polarizing film 430 may overlap the first shielding layer 630 in the display area 10 that is adjacent to the bending area 20. The polarizing film 430 may include a linear polarization film and a λ/4 phase retardation film. The λ/4 phase retardation film may be formed of a birefringent film including a polymer, an alignment film formed of a liquid crystal polymer, a film including an alignment layer formed of a liquid crystal polymer, and the like. The linear polarization film may be formed of an iodine-based material, a dye-containing material, a polyene-based material, and the like.

A bending protection layer 460 may be formed on the first shielding layer 630. The bending protection layer 460 may be formed in a portion of the display area 10, the bending area 20, and a portion of the pad area 30. The bending protection layer 460 may be formed of a photocurable resin, a thermosetting resin, and the like. For example, the bending protection layer 460 may include an epoxy resin, an amino resin, a phenol resin, a urea resin, a melamine resin, an unsaturated polyester resin, a polyurethane resin, a polyimide resin, and the like. According to other embodiments, the bending protection layer 460 may completely cover the first shielding layer 630.

An upper adhesive layer 415 may be formed on the polarizing film 430 and a portion of the bending protection layer 460. The upper adhesive layer 415 may be formed of an OCA, a PSA, an OCR, and the like.

A cover window 410 may be formed on the upper adhesive layer 415. The cover window 410 may be formed of tempered glass, reinforced plastic, and the like.

Figure 19:
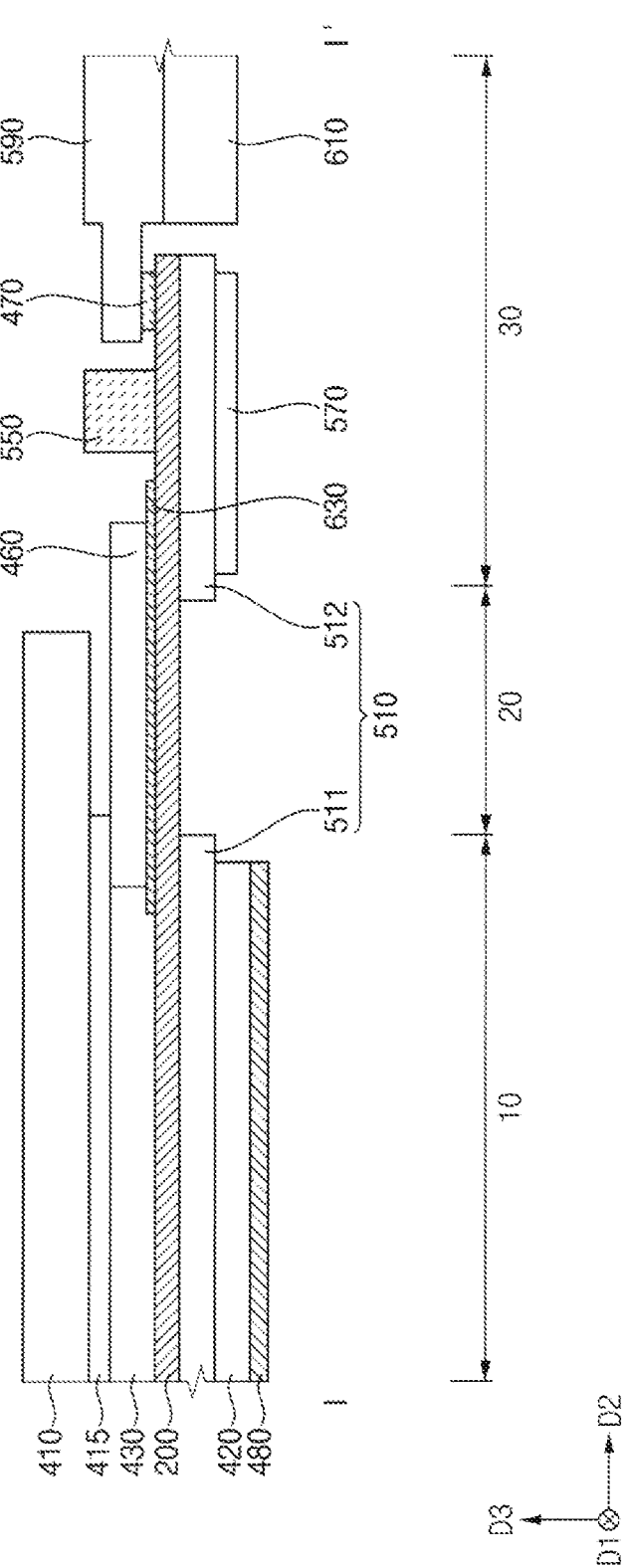

Referring to FIGS. 2 and 19, a driving integrated circuit 550 may be formed in the pad area 30 on the display panel 200, and the driving integrated circuit 550 may be disposed between the connection electrodes 180 and the pad electrodes 470.

One end of a connection film 590 may be connected to the pad electrodes 470, and an opposite end of the connection film 590 may be connected to an external device 101. The connection film 590 may be formed of an FPCB, a PCB, an FFC, and the like.

A conductive tape 610 may be formed on a bottom surface of the connection film 590. The conductive tape 610 may be formed of an anisotropic conductive film and the like.

A lower adhesive layer 420 may be formed on a bottom surface of the first protective film 511. The lower adhesive layer 420 may be formed of an OCA, a PSA, an OCR, and the like.

A spacer 570 may be formed on a bottom surface of the second protective film 512. The spacer 570 may be formed of an organic insulating material.

A functional member 480 may be formed on a bottom surface of the lower adhesive layer 420. The functional member 480 may be formed of a digitizer, a heat dissipation plate, and the like. For example, the heat dissipation plate may be formed of Al, an aluminum-containing alloy, Ag, a silver-containing alloy, W, Cu, a copper-containing alloy, Ni, Cr, Mo, a molybdenum-containing alloy, Ti, Pt, Ta, Nd, Sc, and the like.

Referring to FIG. 5, the display panel 200 disposed in the bending area 20 may be bent. A second shielding layer 530 may be formed in the pad area 30 on a portion of the bending protection layer 460, the driving integrated circuit 550, and a portion of the connection film 590. In other words, the second shielding layer 530 may cover the driving integrated circuit 550 and the pad electrode 470. In some embodiments, the second shielding layer 530 may be formed before the display panel 200 is bent.

An antenna 650 may be provided under the display panel 200 disposed in the pad area 30. The antenna 650 may transmit and receive an RF signal.

Accordingly, a display device 100 including the display panel 200, the lower protective film 510, the lower adhesive layer 420, the spacer 570, the functional member 480, the polarizing film 430, the bending protection layer 460, the upper adhesive layer 415, the cover window 410, the first shielding layer 630, the driving integrated circuit 550, the second shielding layer 530, the connection film 590, the conductive tape 610, and the antenna 650 as shown in FIGS. 1 to 8 may be manufactured.

According to the method of manufacturing the display device of the embodiments, the first shielding layer 630 capable of reflecting or absorbing the RF signal is simultaneously formed with the sensing structure 380 without an additional process, so that a manufacturing cost of the display device 100 may be relatively reduced.

Figure 20:
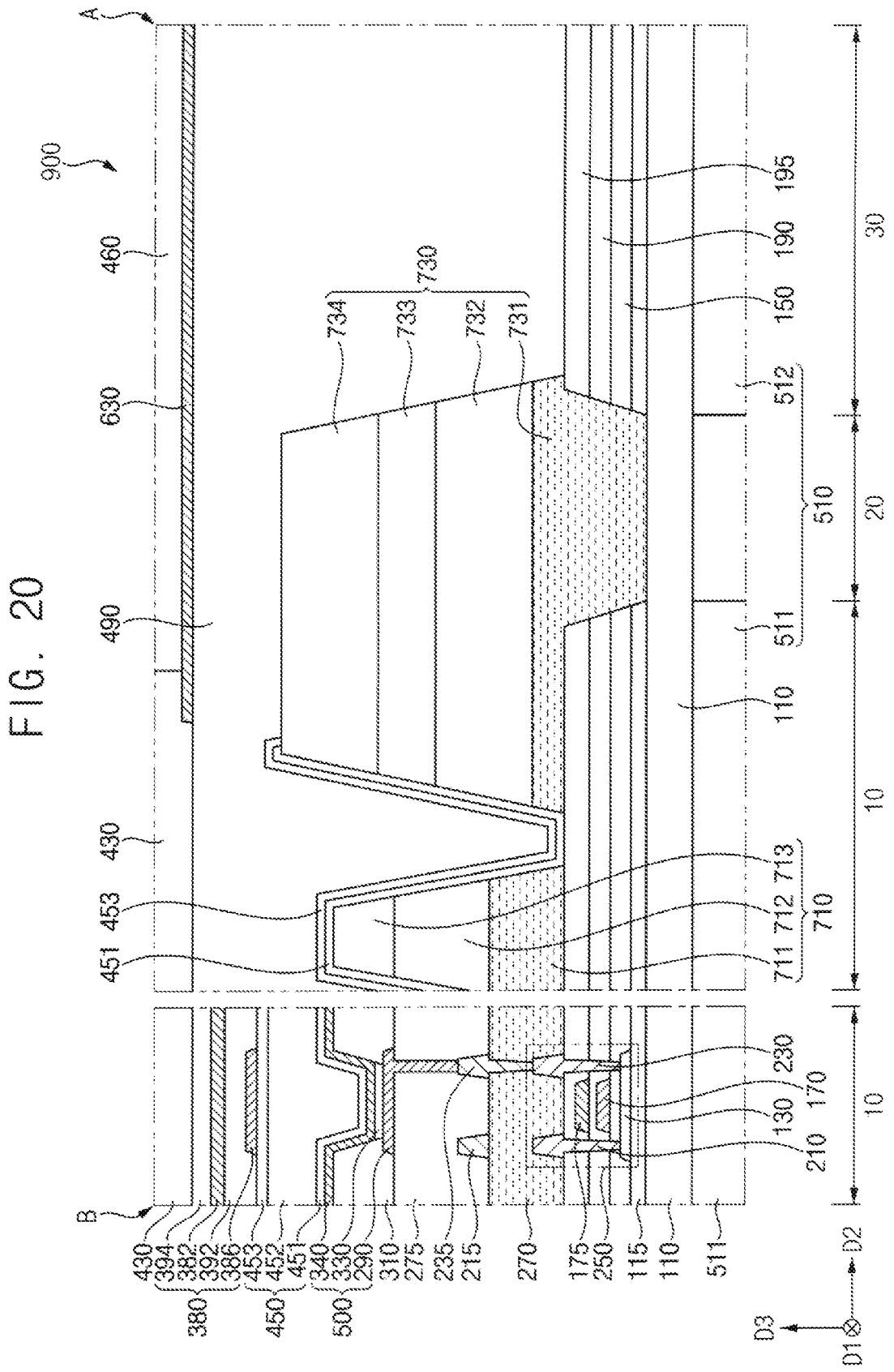
FIG. 20 is a cross-sectional view of another embodiment of a display device constructed according to the principles of the invention.

FIG. 20 is a cross-sectional view of a display device according to embodiments. A display device 900 illustrated in FIG. 20 may have a configuration that is substantially identical or similar to the configuration of the display device 100 described with reference to FIGS. 1 to 8 except for a position of the first shielding layer 630. In FIG. 20, redundant descriptions of components that are substantially identical or similar to the components described with reference to FIGS. 1 to 8 will be omitted.

Referring to FIG. 20, the display device 900 may include a display panel 200, a lower protective film 510, a lower adhesive layer 420, a spacer 570, a functional member 480, a polarizing film 430, a bending protection layer 460, an upper adhesive layer 415, a cover window 410, a first shielding layer 630, a driving integrated circuit 550, a second shielding layer 530, a connection film 590, a conductive tape 610, an antenna 650, and the like. In this case, the display panel 200 may include a substrate 110, a buffer layer 115, a gate insulating layer 150, a first interlayer insulating layer 190, a second interlayer insulating layer 195, a semiconductor element 250, a first planarization layer 270, a second planarization layer 275, a wire pattern 215, a connection pattern 235, a pixel defining layer 310, a display structure 500, a thin film encapsulation structure 450, a sensing structure 380, a blocking structure 710, an organic insulating structure 730, an organic insulating pattern 490, a pad electrode 470, and the like. In addition, the thin film encapsulation structure 450 may include a first inorganic thin film encapsulation layer 451, an organic encapsulation layer 452, and a second inorganic thin film encapsulation layer 453, and the sensing structure 380 may include a sensing connection electrode 386, a first sensing electrode 382, a second sensing electrode 384, a first insulating layer 392, and a second insulating layer 394. Furthermore, the blocking structure 710 may include a first blocking pattern 711, a second blocking pattern 712, and a third blocking pattern 713, and the organic insulating structure 730 may include a first organic insulating layer 731, a second organic insulating layer 732, a third organic insulating layer 733, and a fourth organic insulating layer 734.

The organic insulating pattern 490 may be disposed in the display area 10 that is adjacent to the bending area 20, the bending area 20, and a portion of the pad area 30. In other words, the organic insulating pattern 490 may cover the organic insulating structure 730. The organic insulating pattern 490 may assist formation of the polarizing film 430, the first shielding layer 630, and the bending protection layer 460 by planarizing an uneven surface in the display area 10 that is adjacent to the bending area 20, the bending area 20, and a portion of the pad area 30. In other words, the organic insulating pattern 490 may be disposed on the second inorganic thin film encapsulation layer 453 and the organic insulating structure 730 with a relatively thick thickness. The organic insulating pattern 490 may include an organic insulating material.

The first shielding layer 630 may be disposed in a portion of the display area 10, the bending area 20, and a portion of the pad area 30 on the organic insulating pattern 490. In addition, the first shielding layer 630 may be disposed on the connection electrodes 180, and may cover the connection electrodes 180 (see FIG. 1). The first shielding layer 630 may reflect or absorb an RF signal generated by the antenna 650. In other words, when the first shielding layer 630 is provided, the RF signal may not be transmitted to the connection electrodes 180. In some embodiments, the first shielding layer 630 may extend in the direction opposite to the second direction D2 so as to overlap a portion of the blocking structure 710. In this case, after the organic insulating pattern 490 is formed, the sensing structure 380 and the first shielding layer 630 may be simultaneously formed with each other.

The embodiments may be applied to various electronic devices including a display device. For example, the embodiments may be applied to numerous electronic devices such as vehicle-display devices, ship-display devices, aircraft-display devices, portable communication devices, exhibition display devices, information transfer display devices, medical-display devices, etc.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
   a display panel comprising:
   a substrate having a display area, a bending area, and a pad area,
   a display structure disposed in the display area on the substrate, and
   a sensing structure disposed on the display structure and comprising sensing electrodes;
   an antenna disposed under the display panel in the pad area; a first shielding layer disposed in the bending area on the substrate and comprising a same material as the sensing electrode; and
   a second shielding layer disposed in the pad area and covering a driving integrated circuit,
   wherein one end of the second shielding layer overlaps the first shielding layer in the pad area to form a continuous conductive path between the first and second shielding layers,
   wherein the second shielding layer comprises a conductive adhesive layer, a conductive layer, an adhesive layer, and a signal absorption layer, and wherein, in overlap, the conductive adhesive layer is in direct electrical contact with the first shielding layer to establish the continuous conductive path.

2. The display device of claim 1, wherein the display panel further comprises connection electrodes disposed in the bending area on the substrate, and
   the first shielding layer is disposed on and covers the connection electrodes.

3. The display device of claim 2, wherein the display panel disposed in the bending area is bent.

4. The display device of claim 3, wherein the first shielding layer is configured to prevent a noise signal generated by the antenna from being transmitted to the connection electrode.

5. The display device of claim 1, wherein the first shielding layer comprises:
   a first metal layer comprising titanium;
   a second metal layer disposed on the first metal layer and comprising aluminum; and
   a third metal layer disposed on the second metal layer and comprising titanium.

6. The display device of claim 1, wherein the display panel further comprises an encapsulation structure disposed on the display structure, and
   wherein the encapsulation structure comprises:
   a first inorganic encapsulation layer comprising an inorganic insulating material;

an organic encapsulation layer disposed on the first inorganic encapsulation layer and comprising an organic insulating material; and
   a second inorganic encapsulation layer disposed on the organic encapsulation layer and comprising an inorganic insulating material.

7. The display device of claim 6, wherein the sensing structure comprises:
   a sensing connection electrode disposed on the encapsulation structure;
   a first insulating layer disposed on the sensing connection electrode; and
   a second insulating layer disposed on the first insulating layer, and
   wherein the sensing electrodes are disposed between the first insulating layer and the second insulating layer.

8. The display device of claim 7, wherein the first shielding layer comprises a same material as the sensing connection electrode, a first sensing electrode, or a second sensing electrode.

9. The display device of claim 6, wherein the display panel further comprises:
   insulating layers disposed on the substrate and comprising openings that expose a top surface of the substrate disposed in the bending area;
   a blocking structure disposed in the display area that is adjacent to the bending area on the insulating layers and configured to prevent a leakage of the organic encapsulation layer; and
   an organic insulating structure disposed in the openings of the insulating layers on the substrate.

10. The display device of claim 9, wherein the display panel further comprises:
    a first planarization layer disposed in the display area on the insulating layers;
    a second planarization layer disposed on the first planarization layer; and
    a pixel defining layer disposed on the second planarization layer.

11. The display device of claim 10, wherein the blocking structure comprises:
    a first blocking pattern comprising a same material as the first planarization layer;
    a second blocking pattern disposed on the first blocking pattern and comprising a same material as the second planarization layer; and
    a third blocking pattern disposed on the second blocking pattern and comprising a same material as the pixel defining layer.

12. The display device of claim 10, wherein the organic insulating structure comprises:
    a first organic insulating layer filling the openings and comprising a same material as the first planarization layer;
    a second organic insulating layer disposed on the first organic insulating layer and comprising a same material as the second planarization layer;
    a third organic insulating layer disposed on the second organic insulating layer and comprising a same material as the pixel defining layer; and
    a fourth organic insulating layer disposed on the third organic insulating layer.

13. The display device of claim 9, wherein a portion of the first shielding layer is disposed on a top surface of the organic insulating structure.

14. The display device of claim 9, wherein the display panel further comprises an organic insulating pattern disposed on the blocking structure and the organic insulating structure, and the first shielding layer is disposed on the organic insulating pattern.

15. The display device of claim 1, wherein a conductive adhesive layer of the second shielding layer is in direct electrical contact with an upper surface of the driving integrated circuit, and a signal absorption layer of the second shielding layer comprises polyethylene terephthalate (PET) having a black color.

16. The display device of claim 15, wherein the first shielding layer is disposed on and covers connection electrodes in the bending area and extends continuously into the pad area, and the overlap between the first shielding layer and the second shielding layer is located in the pad area adjacent to the bending area.

17. The display device of claim 15, wherein the display panel further comprises pad electrodes spaced apart from the driving integrated circuit in the pad area on the substrate, and the display device further comprises a connection film connected to the pad electrodes and configured to transmit signals generated by an external device to the display panel through the pad electrodes.

18. The display device of claim 17, wherein a portion of the second shielding layer overlaps the connection film.

19. The display device of claim 1, further comprising a bending protection layer disposed on the first shielding layer and configured to move a neutral plane of the display device in the bending area toward the bending protection layer.

20. The display device of claim 1, further comprising a polarizing film disposed on the sensing structure and configured to block an external light that is incident from an outside.

21. A display device comprising:

a substrate having a display area, a bending area, and a pad area, and bent in the bending area;

a display structure disposed in the display area on the substrate;

a sensing structure disposed on the display structure and comprising sensing electrodes;

connection electrodes disposed in the bending area on the substrate;

a first shielding layer covering the connection electrodes on the connection electrodes and comprising a same material as the sensing electrode;

a driving integrated circuit disposed in the pad area on the substrate; and a second shielding layer covering the driving integrated circuit on the driving integrated circuit wherein one end of the second shielding layer overlaps the first shielding layer in the pad area to form a continuous conductive path between the first and second shielding layers, wherein the second shielding layer comprises a conductive adhesive layer, a conductive layer, an adhesive layer, and a signal absorption layer, and wherein, in the overlap, the conductive adhesive layer is in direct electrical contact with the first shielding layer to establish the continuous conductive path.

22. The display device of claim 21, wherein:

the first shielding layer and the second shielding layer are noise blocking layers, and the second shielding layer includes a different material from the first shielding layer.

\* \* \* \* \*